(12) United States Patent
Fujii

(10) Patent No.: US 8,017,186 B2
(45) Date of Patent: Sep. 13, 2011

(54) FILM FORMING METHOD, DISCHARGING DROPLET METHOD AND DROPLET DISCHARGING DEVICE

(75) Inventor: Gen Fujii, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 900 days.

(21) Appl. No.: 11/889,683

(22) Filed: Aug. 15, 2007

(65) Prior Publication Data

US 2008/0041973 A1 Feb. 21, 2008

(30) Foreign Application Priority Data

Aug. 17, 2006 (JP) ................... 2006-222722

(51) Int. Cl.
*B05B 1/02* (2006.01)
*B41J 2/135* (2006.01)
(52) U.S. Cl. ............ 427/294; 118/50; 239/347; 347/92; 427/296; 427/421.1
(58) Field of Classification Search ............... 427/421.1, 427/294; 347/92
See application file for complete search history.

(56) References Cited

U.S. PATENT DOCUMENTS

| | | | |
|---|---|---|---|
| 4,340,895 A * | 7/1982 | Kikuchi | ........................ 347/92 |
| 6,390,611 B1 | 5/2002 | Kobayashi et al. | |
| 6,709,092 B2 | 3/2004 | Hayashi et al. | |
| 7,090,341 B1 | 8/2006 | Miyazawa | |
| 7,176,069 B2 | 2/2007 | Yamazaki et al. | |
| 2001/0023661 A1 | 9/2001 | Hiroki et al. | |
| 2006/0028503 A1 | 2/2006 | Yamazaki et al. | |
| 2006/0040435 A1* | 2/2006 | Morisue et al. | ............... 438/151 |
| 2007/0057258 A1 | 3/2007 | Fukuchi et al. | |

FOREIGN PATENT DOCUMENTS

| | | | |
|---|---|---|---|
| JP | 10-181038 | | 7/1998 |
| JP | 2000246007 A | * | 9/2000 |
| JP | 2001-162817 | | 6/2001 |
| JP | 2006-159722 | | 6/2006 |
| JP | 2006159722 A | * | 6/2006 |
| JP | 2006-240147 | | 9/2006 |

* cited by examiner

*Primary Examiner* — Katherine A Bareford
*Assistant Examiner* — Alexander Weddle
(74) *Attorney, Agent, or Firm* — Nixon Peabody LLP; Jeffrey L. Costellia

(57) ABSTRACT

The present invention provides film forming method and a droplet discharge method for removing bubbles in a pressurizing chamber to prevent defective discharge without disposing a large amount of materials in a droplet discharging device. Before a material is discharged in the droplet discharging device, a step is provided in which reduced pressure is kept in a pressurizing chamber and a material supply portion, which are connected, to remove bubbles that exist in the pressurizing chamber. A flow path connected to the outside such as an opening of a nozzle surface of the pressurizing chamber or a material supply port of the material supply portion is sealed, and pressure in the pressurizing chamber and the material supply portion is reduced from an inlet and outlet connected to the material supply portion with the use of a reduced pressure means such as a pump.

32 Claims, 8 Drawing Sheets

FILM FORMING METHOD, DISCHARGING DROPLET METHOD AND DROPLET DISCHARGING DEVICE

BACKGROUND OF THE INVENTION

1. Field of the Invention

The present invention relates to methods for selectively forming objects (for example, a film, a wiring, an insulating layer, a mask, or the like) by discharge of droplets. In detail, the present invention relates to film forming devices, film forming methods, droplet discharge devices and droplet discharge methods, which are used in manufacturing components used for semiconductor devices, display devices, and the like.

2. Description of the Related Art

In the droplet discharge method typified by an ink-jet method, a material supplied from a material supply container is discharged (ejected) from an outlet through a pressurizing chamber (also referred to as a pumping chamber). In the pressurizing chamber, pressure is applied using a piezoelectric converting system (such as a piezoelectric element) or a thermal conversion system, thereby discharging the material therefrom.

In some cases, bubbles are in the pressurizing chamber due to mixture of air, or the like when supplying the material to the pressurizing chamber. Since the bubbles are gas, bubbles easily expand and shrink than liquid. Therefore, when bubbles are in the pressurizing chamber, the applied pressure is absorbed by the gas. Consequently, inability to apply sufficient pressure to liquid causes defective discharge. In addition, there is a possibility that even a bubble that is in the material supply container also flows into the pressurizing chamber during discharging and causes defective discharge.

As a method for removing such bubbles in the pressurizing chamber, there is a method in which bubbles in the material in a head portion are exhausted by exhausting the material from an outlet. Such a method has also been proposed in which hydrophilization treatment is performed inside a supply pipe where ink is supplied so that a bubble is removed more easily (for example, see Patent Document 1: Japanese Published Patent Application No. 2001-162817).

However, with the use of the method in which bubbles are removed by exhaust of a material as described above, a large quantity of materials is consumed in vain, which causes great loss in cost. In addition, depending on characteristics of materials, for example, in materials containing surfactants having a high foaming property such as fluorine-based surfactants it is difficult to remove a bubble completely just by exhaust of a large quantity of the materials.

SUMMARY OF THE INVENTION

The present invention provides a droplet discharge method in which bubbles in a pressurizing chamber are removed without wasting of a large quantity of materials so as to prevent defective discharging in a droplet discharge device.

In the present invention, before a material is discharged, a step is provided in which a reduced pressure state is kept in a pressurizing chamber, a material supply path, and a material supply chamber, which are connected, to remove bubbles that are in the pressurizing chamber. The pressurizing chamber and the material supply chamber are connected through the material supply path, and the pressurizing chamber is filled with the material supplied from the material supply chamber through the material supply path.

Since a volume of bubbles Vb is in inverse proportion to a pressure Pt in the pressurizing chamber, the material supply path, and the material supply chamber, it follows that $Vb=C/Pt$; whereas, since a buoyancy F applied to the bubbles is in proportion to the volume of the bubbles Vb and density $\rho i$ of a material, it follows that $F=C \times \rho i/Pt$. Note that C is a constant. When the pressure Pt in the pressurizing chamber, the material supply path, and the material supply chamber is reduced, the buoyancy F applied to the bubbles increases. Consequently, the buoyancy is applied to the bubbles that are in the material, and the bubbles rise (are transferred) from the pressurizing chamber to the material supply chamber where there is the liquid surface of the material.

Therefore, the bubbles can be removed from the pressurizing chamber. In addition, in the material supply chamber, the bubbles rise to the surface of the solution and break or remain on the liquid surface of the material by being foamed. Therefore, a risk that the bubbles will flow into (enter) the pressurizing chamber can be reduced substantially.

Flow paths connected to an outside other than a gas supply/exhaust portion, such as an outlet provided for the pressurizing chamber and a material supply port of the material supply chamber are sealed, and a pressure in the pressurizing chamber, the material supply path, and the material supply chamber is reduced using a pressure reducing means such as a pump which is provided in the gas supply/exhaust portion.

One mode of methods of the present invention includes the steps of supplying a liquid composition containing film-forming material to a material supply chamber; supplying the composition containing film-forming material to a pressurizing chamber provided with an outlet through a material supply path from the material supply chamber; sealing the outlet; reducing a pressure in the material supply chamber, the material supply path, and the pressurizing chamber; further pressurizing the material supply chamber, the material supply path, and the pressurizing chamber from the reduced pressure state; opening the outlet; and pressurizing the pressurizing chamber to discharge the composition containing film-forming material from the outlet so as to form a film.

Another mode of methods of the present invention includes the steps of supplying a liquid composition containing film-forming material to a material supply chamber provided with a gas supply/exhaust portion; supplying the composition containing film-forming material to a pressurizing chamber provided with an outlet through a material supply path from the material supply chamber; sealing the outlet; reducing pressure in the material supply chamber, the material supply path by exhausting air from the gas supply/exhaust portion, pressurizing the material supply chamber, the material supply path, and the pressurizing chamber from the reduced pressure state by supplying air from the gas supply/exhaust portion; opening the outlet; and pressurizing the pressurizing chamber to discharge the composition containing film-forming material from the outlet so as to form a film.

Another mode of methods of the present invention includes the steps of supplying a liquid composition containing film-forming material to a material supply chamber; supplying the composition containing film-forming material to a pressurizing chamber provided with an outlet through a material supply path from the material supply chamber; sealing the outlet; reducing pressure in the material supply chamber, the material supply path, and the pressurizing chamber to transfer a bubble that is in the pressurizing chamber to the material supply chamber; pressurizing the material supply chamber, the material supply path, and the pressurizing chamber from the reduced pressure state; opening the outlet; and pressurizing the pressurizing chamber to discharge the composition containing film-forming material from the outlet so as to form a film.

Another mode of a methods of the present invention includes the steps of supplying a liquid composition containing film-forming material to a material supply chamber provided with a gas supply/exhaust portion; supplying the composition containing film-forming material to a pressurizing chamber provided with an outlet through a material supply path from the material supply chamber; sealing the outlet; reducing pressure in the material supply chamber, the material supply path, and the pressurizing chamber by exhausting air from the gas supply/exhaust portion to transfer a bubble that is in the pressurizing chamber to the material supply chamber; pressurizing the material supply chamber, the material supply path, and the pressurizing chamber from the reduced pressure state by supplying air from the gas supply/exhaust portion; opening the outlet; and pressuring the pressurizing chamber to discharge the composition containing film-forming material from the outlet so as to form a film.

In the above structures, after pressure in the material supply chamber is reduced, the pressurizing chamber may be vibrated in a reduced pressure state in order to efficiently remove bubbles that are in the pressurizing chamber by being transferred to the material supply chamber. The pressurizing chamber is vibrated, whereby bubbles that are trapped in an uneven form in the pressurizing chamber are transferred and the bubbles can be efficiently removed from the pressurizing chamber. In addition, the outlet can be sealed by a sealant, an adhesive tape, or the like.

In the above structures, the composition containing film-forming material may be set as appropriate depending on a film to be formed, and a composition containing a conductive material may be used in a case of forming a conductive film. Similarly, a composition containing an insulating material may be used in a case of forming an insulating film, and a composition containing a semiconductor material may be used in a case of forming a semiconductor film. Moreover, the composition containing film-forming material may include a surfactant having fluorine.

One mode of a droplet discharge device of the present invention includes a head portion; a gas supply/exhaust port provided in the head portion; a pressure control means which controls pressure in the head portion which is connected to the gas supply/exhaust port; a sealant; a stage in which an object to be treated is provided; and a scanning unit for relatively scanning the head portion and the sealant and relatively scanning the head portion and the stage.

Another mode of a droplet discharge device of the present invention includes a head portion; a gas supply/exhaust port opened and closed by a first cock and a material supply port opened and closed by a second cock which are provided in the head portion; a pressure control means which controls pressure in the head portion which is connected to the gas supply/exhaust port through the first cock; a material storage chamber which is connected to the material supply port through the second cock; a supply means which supplies a material into the head portion from the material storage chamber; a sealant; a stage in which an object to be treated is provided; and a scanning unit for relatively scanning the head portion and the sealant and relatively scanning the head portion and the stage.

In the above structures, a pressure reducing means which reduces pressure in the material storage chamber may be included. In addition, a cleaning solution discharging means which discharges a cleaning solution which washes away the sealant may be included. Moreover, a waste-solution storage chamber for disposing a waste solution which washes away the sealant may be included.

The present invention can also be used for a display device that is a device having a display function. The display device using the present invention includes, in its category, a light-emitting display device where a TFT is connected to a light-emitting element in which a layer containing an organic material, an inorganic material, or a mixture of organic and inorganic materials which emits light called electroluminescence (hereinafter also referred to as "EL"), is interposed between electrodes, a liquid crystal display device using a liquid crystal element including a liquid crystal material as a display element, and the like. In the present invention, a "display device" refers to devices having display elements (liquid crystal elements, light-emitting elements, or the like). Note that the display device also includes a display panel itself where a plurality of pixels including a display element such as a liquid crystal element or an EL element, and a peripheral driver circuit for driving the pixels are formed over a substrate. Further, it may include a flexible printed circuit (FPC) or a printed wiring board (PWB) attached to a display panel (an IC, a resistive element, a capacitor element, an inductor, a transistor, or the like). Such display devices may also include an optical sheet such as a polarizing plate or a retardation plate. Further, it may include a backlight (which may include a light guide plate, a prism sheet, a diffusion sheet, a reflective sheet, and a light source (an LED, a cold-cathode tube, or the like)).

Note that a display element or a display device may be in various modes and may include various elements. For example, there are display media of which contrast changes by an electromagnetic function, such as EL elements (organic EL elements, inorganic EL elements, EL elements that contain both organic materials and inorganic materials, or the like), electron-emissive elements, liquid crystal elements, electronic inks, grating light valves (GLV), plasma displays (PDP), digital micromirror devices (DMD), piezoceramic displays, and carbon nanotubes. In addition, display devices using an EL element include EL displays; display devices using an electron-emissive element include field emission displays (FED), surface-conduction electron-emitter displays (SED), and the like; display devices using a liquid crystal element include liquid crystal displays, transmissive liquid crystal displays, semi-transmissive liquid crystal displays, and reflective liquid crystal displays; and display devices using electronic ink include electronic papers.

In addition, with the use of the present invention, devices including a circuit having a semiconductor element (such as a transistor, a memory element, or a diode) or semiconductor devices such as chips having processor circuits can be manufactured. Note that, in the present invention, a "semiconductor device" indicates general devices which can function with the utilization of semiconductor characteristics.

According to the present invention, bubbles in a pressurizing chamber can be removed without disposing of a large quantity of materials in a droplet discharge method using a droplet discharge device; thus, defective discharging can be prevented.

Thus, a wiring such as a conductive layer or an insulating layer, which is manufactured using the droplet discharge method of the present invention, can prevent a defective shape such as disconnection due to defective discharging. With the use of the wiring or the insulating layer formed by the present invention, a semiconductor device or a display device which is highly reliable can be manufactured at low cost with high yield.

DETAILED DESCRIPTION OF THE INVENTION

Figure 1A:
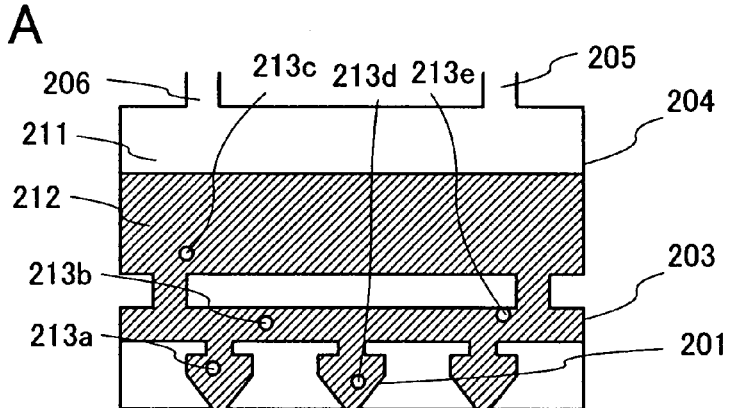
FIGS. 1A to 1D are conceptual diagrams illustrating a droplet discharge device of the present invention.
Figure 1B:
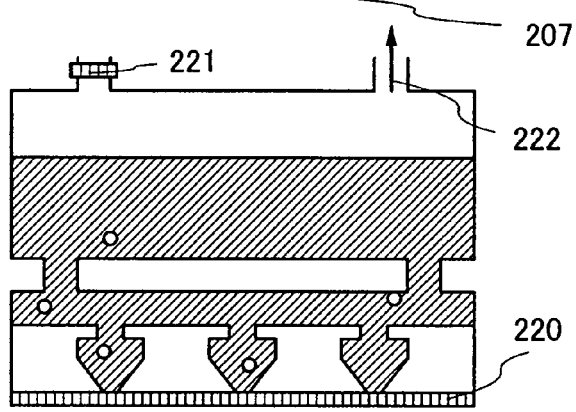
Figure 1C:
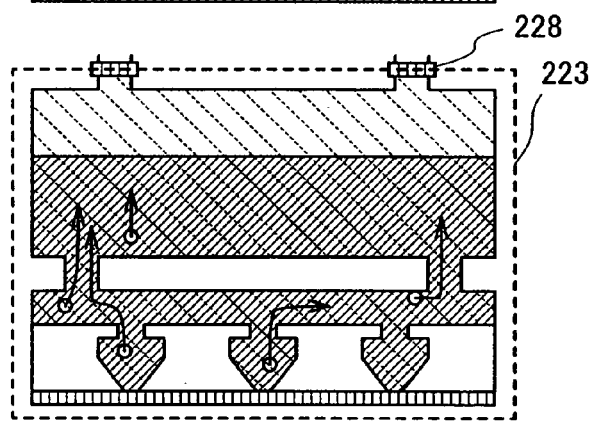

Embodiment modes of the present invention will be explained hereinafter with reference to the accompanying drawings. However, it is to be easily understood that various changes and modifications in modes and details thereof will be apparent to those skilled in the art without departing from the purpose and the scope of the present invention. Therefore, the present invention should not be interpreted as being limited to the description of the embodiment modes below. Note that, in the following structures of the present invention to be explained, the same portions or portions having the same function are denoted by the same reference numerals among different drawings, and repetitive explanation thereof will be omitted.

Embodiment Mode 1

In this embodiment mode, a droplet discharge method in which bubbles in a pressurizing chamber are removed without disposing of a large quantity of materials so as to prevent defective discharging will be explained with reference to FIGS. 1A to 1D and FIGS. 2A and 2B.

With the use of a droplet discharge method of the present invention, components necessary for manufacturing a display device and the like such as a conductive layer for forming a wiring layer or an electrode and a mask layer for forming a predetermined pattern can selectively be formed in desired shapes. In the present invention, a constituent (also referred to as a pattern) refers to a conductive layer such as a wiring layer, a gate electrode layer, a source electrode layer, or a drain electrode layer; a semiconductor layer; a mask layer; an insulating layer; or the like which constitutes a thin film transistor or a display device, and the constituent includes all constituent elements formed to have a predetermined shape. A droplet discharge method (also referred to as an ink-jet method depending on its system) is a method capable of selectively forming a formation in a desired pattern, whereby a conductive layer, an insulating layer, or the like is formed in a predetermined pattern by selective discharging (jetting) of a droplet of a composition which is mixed for a particular purpose. In a region where the constituent is to be formed, droplets containing a material for forming the constituent is discharged, baked, and dried etc., to be fixed, whereby the constituent with a desired pattern is formed.

Figure 2A:
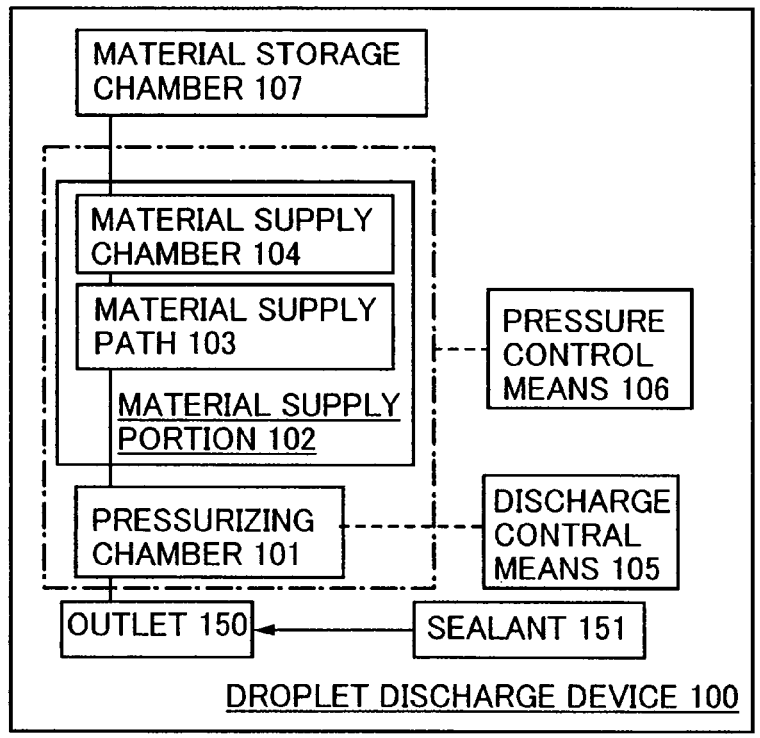
FIGS. 2A and 2B are block diagrams illustrating a droplet discharge device of the present invention.
Figure 2B:
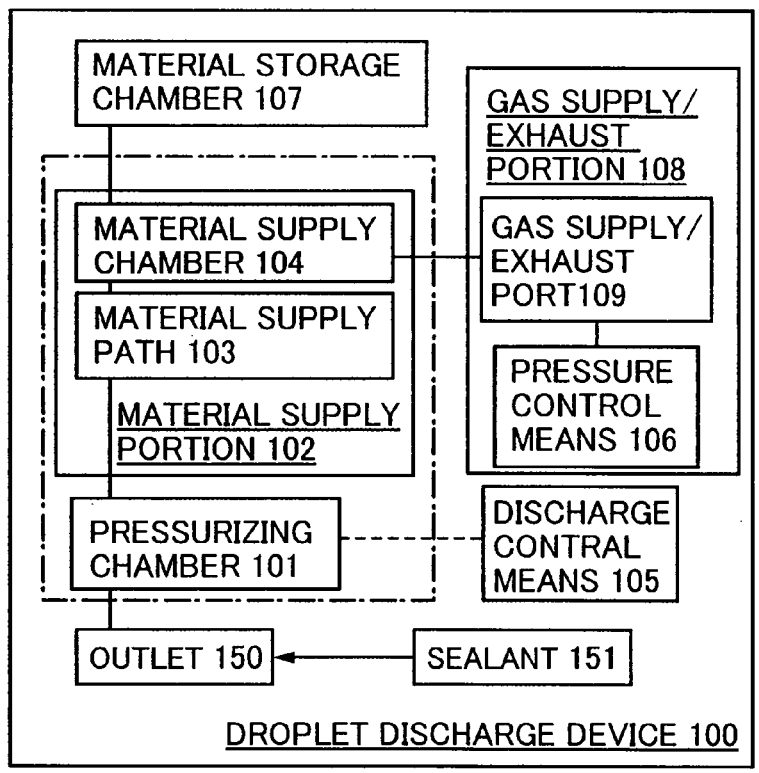

A block diagram of a droplet discharge device in this embodiment mode is illustrated in FIGS. 2A and 2B. FIG. 2B is a more specific example of FIG. 2A.

As illustrated in FIG. 2A, a droplet discharge device 100 has a pressurizing chamber 101, a material supply portion 102 including a material supply path 103 and a material supply chamber 104, a material storage chamber 107, a discharge control means 105 for the pressurizing chamber 101, and a pressure control means 106 which controls pressure in the pressurizing chamber 101 and the material supply portion 102, which are surrounded with a dashed line. The pressurizing chamber 101 is provided with an outlet 150, which can be sealed with a sealant 151. Note that the pressurizing chamber 101 and the outlet 150 can also be collectively referred to as a nozzle.

In FIG. 2B, the material supply chamber 104 is provided with a gas supply/exhaust port 109 in a gas supply/exhaust portion 108, and gas is supplied or exhausted by the pressure control means 106 connected to the gas supply/exhaust port 109, whereby pressure in the pressurizing chamber 101 and the material supply portion 102 (the material supply path 103 and the material supply chamber 104) is controlled. For example, when exhaust is performed with a pump or the like as the pressure control means 106, a reduced pressure state can be kept in the pressurizing chamber 101 and the material supply portion 102 (the material supply path 103 and the material supply chamber 104). On the other hand, when gas is supplied, a pressurized state can be kept in the pressurizing chamber 101 and the material supply portion 102 (the material supply path 103 and the material supply chamber 104).

The droplet discharge method in this embodiment mode with the use of the present invention will be explained with reference to FIGS. 1A to 1D. FIG. 1A illustrates a droplet discharge device including a pressurizing chamber 201, a material supply path 203, a material supply chamber 204, a material supply port 206, a gas supply/exhaust port 205, and an outlet 207, which is filled with a composition 212 containing film-forming material (a composition containing a material of a film to be formed). The composition containing film-forming material is supplied to the material supply chamber 204 from the material supply port 206 and supplied to the pressurizing chamber 201 from the material supply chamber 204 through the material supply path 203 to fill the pressurizing chamber 201. In the material supply chamber 204, there is a space 211 above the composition 212 containing film-forming material. In this embodiment mode, the space 211 includes the air.

As illustrated in FIG. 1A, bubbles 213a to 213e may be in the material supply chamber 204, the material supply path 203, and the pressurizing chamber 201 by mixture of air, or the like in supplying the material to the material supply chamber and the pressurizing chamber. Since the bubbles 213a to 213e are gas, bubbles easily expand and shrink than liquid. Therefore, when bubbles (a bubble such as the bubbles 213a and 213d in FIG. 1A) are in the pressurizing chamber, the applied pressure is absorbed by the gas. Consequently, inability to apply sufficient pressure to liquid causes defective discharge. In addition, there is a possibility that even a bubble that is in the material supply path and the material supply chamber (a bubble such as the bubbles 213b, 213c, and 213e in FIG. 1A) also flows into the pressurizing chamber in the middle of discharging and causes defective discharge.

In the present invention, before the composition containing film-forming material, which is a material, is discharged, a step is provided in which a reduced pressure state is kept in the pressurizing chamber 201, the material supply path 203, and the material supply chamber 204, which are connected, and bubbles that are in the pressurizing chamber 201 are removed.

Flow paths connected to an outside other than the gas supply/exhaust portion, such as the outlet provided for the pressurizing chamber and the material supply port of the material supply chamber are sealed, and pressure in the pressurizing chamber, the material supply path, and the material supply chamber is reduced using the pressure control means such as a pump which is provided with the gas supply/exhaust portion. Specifically, as in FIG. 1B, the outlet is sealed with a sealing plate 220 and the material supply port 206 is also sealed with a cock 221.

The gas in the pressurizing chamber 201, the material supply path 203, and the material supply chamber 204, which become a closed space hermetically sealed by the sealing plate 220 and the cock 221, is exhausted from the gas supply/exhaust port 205 which constitutes a gas supply/exhaust portion as indicated by an arrow 222. The gas is exhausted from the gas supply/exhaust port; therefore, pressure in the pressurizing chamber 201, the material supply path 203, and the material supply chamber 204 is reduced. After that, also the gas supply/exhaust port 205 is sealed by a cock 228, and pressure in the pressurizing chamber 201, the material supply path 203, and the material supply chamber 204 is reduced to make a reduced pressure state 223 (see FIG. 1C).

Since a volume of bubbles $V_b$ is in inverse proportion to a pressure $P_t$ in the pressurizing chamber 201, the material supply path 203, and the material supply chamber 204, it follows that $V_b=C/P_t$; whereas, since a buoyancy F applied to the bubbles is in proportion to the volume of the bubbles $V_b$ and density $\rho_i$ of a material, it follows that $F=C \times \rho_i/P_t$. Note that C is a constant. When the pressure $P_t$ in the pressurizing chamber 201, the material supply path 203, and the material supply chamber 204 is reduced, the buoyancy F applied to the bubbles increases. Consequently, the buoyancy is applied to the bubbles 213a to 213e that are in the material as in arrows, and the bubbles rise (are transferred) from the pressurizing chamber 201 to the material supply chamber 204 where there is the liquid surface of the material.

Figure 1D:
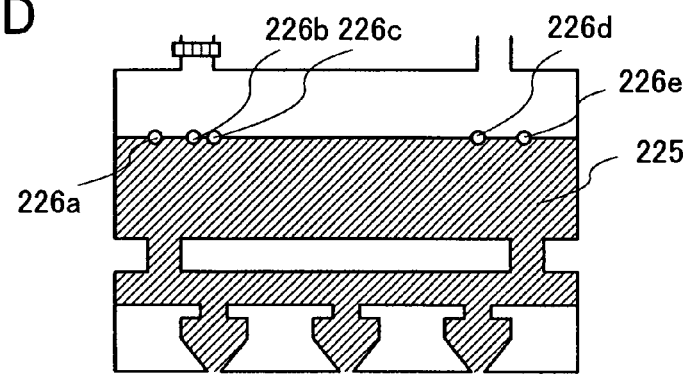

Consequently, as illustrated in FIG. 1D, the bubbles rise to an interface of the composition containing film-forming material, which is a material, as bubbles 226a to 226e. Thus, the bubbles can be removed from the pressurizing chamber 201. In addition, in the material supply chamber 204, the bubbles rise to the liquid surface of the material and break or remain there. Therefore, a risk that the bubbles will flow into (enter) the pressurizing chamber 201 can be reduced substantially.

After a reduced pressure state is kept in the pressurizing chamber 201, the material supply path 203, and the material supply chamber 204 and the bubbles are discharged from the composition containing film-forming material to the interface, the cock 228 of the gas supply/exhaust port is opened and gas is supplied by the pressure control means. Accordingly, a normal pressure or pressurized state is kept in the pressurizing chamber 201, the material supply path 203, and the material supply chamber 204 to remove the sealing plate 220. After that, voltage is applied to the pressurizing chamber 201 so that the composition containing film-forming material 225 can be discharged from the outlet 207.

After pressure in the pressurizing chamber, the material supply path, and the material supply chamber is reduced, the pressurizing chamber may be vibrated in a reduced pressure state in order to efficiently remove bubbles that are in the pressurizing chamber by being transferred to the material supply chamber. The pressurizing chamber is vibrated, whereby bubbles that are trapped in an uneven form in the pressurizing chamber are transferred and the bubbles can be efficiently removed from the pressurizing chamber. In addition, as long as an opening is sealed with the sealing plate (sealant), a sealing plate of any material or shape may be used. A flexible material is preferably used, and resin in gel or gum, or the like can be used. Alternatively, the opening can be sealed with good adhesion by an adhesive tape or the like. Note that, as the material used for the sealing plate (sealant), a material that does not react with the composition containing film-forming material to be discharged is preferable.

As resin that can be used as the sealant, for example, the following can be used: an acrylic resin, a melamine resin, a urethane resin, a bisphenol-A liquid resin, a bisphenol-A solid resin, a bromine-containing epoxy resin, a bisphenol-F resin, a bisphenol-AD resin, a phenol resin, a cresol resin, a novolac resin, a cycloaliphatic epoxy resin, an Epi-Bis type (Epichlorohydrin-Bisphenol) epoxy resin, a glycidyl ester resin, a glycidyl amine-based resin, an epoxy resin such as a heterocyclic epoxy resin or a modified epoxy resin, or a silicone resin.

In addition, in order to seal the material supply port provided between the material supply chamber and a material storage chamber or seal the gas supply/exhaust port in the gas supply/exhaust portion, the connected paths (pipes) may be blocked using a valve, a cock, or the like.

Gas may be exhausted using a pump such as a rotary pump or a diffusion pump as the pressure control means. In addition, in order to control pressure, the pressurizing chamber, the material supply path, and the material supply chamber may be exhausted with a pump or the like while the pressure is controlled with a manometer (a vacuometer).

The composition containing film-forming material may be set as appropriate depending on a film to be formed, and a composition containing a conductive material may be used in a case of forming a conductive film. Similarly, a composition containing an insulating material may be used in a case of forming an insulating film, and a composition containing a semiconductor material may be used in a case of forming a semiconductor film. Moreover, the composition containing film-forming material may include a surfactant having fluorine.

A droplet discharge means is generally a means which discharges droplets, such as a head having one or a plurality of nozzles including a composition outlet. The diameter of each nozzle of the droplet discharge means is set 0.02 to 100 μm (preferably less than or equal to 30 μm) and the quantity of composition discharged from the nozzle is 0.001 to 100 pl (preferably greater than or equal to 0.1 pl and less than or equal to 40 pl, more preferably less than or equal to 10 pl). The discharge quantity is increased in proportion to the area of the outlet of the nozzle. The distance between an object to be processed and the outlet of the nozzle is preferably as short as possible in order to drop the droplet at a desired position; the distance is preferably set to be 0.1 to 3 mm (more preferably less than or equal to 1 mm).

As the composition to be discharged from the outlet in a case of forming a conductive film as the film, a conductive material dissolved or dispersed in a solvent is used. The conductive material corresponds to fine particles or dispersed nanoparticles of one or more kinds of metals such as Ag, Au, Cu, Ni, Pt, Pd, Ir, Rh, W, or Al. In addition, fine particles or dispersed nanoparticles of one or more kinds of metal sulfide such as Cd or Zn; oxide of Fe, Ti, Ge, Si, Zr, or Ba; or silver halide may be mixed into the conductive material. Alternatively, as the conductive material, indium tin oxide (ITO), indium tin oxide containing silicon oxide (ITSO), organic indium, organic tin, zinc oxide, each used as a transparent conductive film, titanium nitride, or the like may be used. As the conductive material, particles of a single element may be used or plural kinds of elements may be used in mixture. Also, as the composition discharged from the outlet, any of the materials of gold, silver, and copper dissolved or dispersed in a solvent is preferably used in consideration of specific resistance, and it is more preferable to use silver or copper having low resistance. Note that, when silver or copper is used, a barrier film may be provided in addition as a countermeasure against impurities. A silicon nitride film or a nickel boron (NiB) film can be used as the barrier film.

The composition to be discharged is a conductive material (an insulating material) dissolved or dispersed in a solvent, which further contains a dispersant or a thermosetting resin which is referred to as a binder. In particular, the binder has a function of preventing generation of cracks or uneven portion during baking. Thus, a formed conductive layer may contain an organic material. The contained organic material is different depending on heating temperature, atmosphere, or heating time. This organic material is an organic resin which functions as a binder, a solvent, a dispersant, and a coating of a metal particle, or the like; typically, an organic resin such as polyimide, acrylic, a novolac resin, a melamine resin, a phenol resin, an epoxy resin, a silicone resin, a furan resin, or a diallyl phthalate resin can be given as examples.

In addition, a particle with a plurality of layers, in which a conductive material is coated with another conductive material, may also be used. For example, a particle with a three-layer structure in which copper is coated with nickel boron (NiB) and the nickel boron is further coated with silver, or the like may be used. As for the solvent, esters such as butyl acetate or ethyl acetate, alcohols such as isopropyl alcohol or ethyl alcohol, an organic solvent such as methyl ethyl ketone or acetone, or water is used. The viscosity of the composition is preferably less than or equal to 20 mPa·s, which prevents the composition from drying, and enables the composition to be discharged smoothly from the outlet. The surface tension of the composition is preferably less than or equal to 40 mN/m. However, the viscosity of the composition and the like may be controlled as appropriate depending on a solvent to be used or an intended purpose. For example, the viscosity of a composition in which ITO, organic indium, or organic tin is dissolved or dispersed in a solvent may be set to be 5 to 20 mPa·s, the viscosity of a composition in which silver is dissolved or dispersed in a solvent may be set to be 5 to 20 mPa·s, and the viscosity of a composition in which gold is dissolved or dispersed in a solvent may be set to be 5 to 20 mPa·s.

In a case of forming an insulating layer that can be used for a mask layer or the like as the film, an organic material such as an epoxy resin, a phenol resin, a novolac resin, an acrylic resin, a melamine resin, a urethane resin, benzocyclobutene, parylene, fluorinated arylene ether, or polyimide; or a resin having a siloxane bond is used to form the insulating layer with a droplet discharge method. Regardless of any of the materials used, the surface tension and the viscosity are controlled as appropriate by adjustment of the concentration of a solvent or addition of a surfactant or the like.

The diameter of particles of the conductive material is preferably as small as possible for the purpose of preventing nozzles from being clogged and for manufacturing a minute pattern, although it depends on the diameter of each nozzle, a desired shape of a pattern, or the like. Preferably, the diameter of the particles of the conductive material is less than or equal to 0.1 µm. The composition is formed by various methods such as an electrolyzing method, an atomizing method, or a wet reduction method, and the particle size is generally approximately 0.01 to 10 µm. However, when a gas evaporation method is employed, a nanoparticle protected by a dispersant is as minute as approximately 7 nm, and when the surface of each particle is covered with a coating, the nanoparticles do not aggregate in the solvent and are stably dispersed in the solvent at room temperature, and behave similarly to liquid. Thus, it is preferable to use a coating.

In addition, the step of discharging the composition may be performed under reduced pressure. Also, a substrate may be heated when the composition is discharged. After the composition is discharged, either drying or baking, or both of them are performed. Both the drying step and baking step are heat treatment; however, for example, drying is performed at 100° C. for 3 minutes and baking is performed at temperatures of 200 to 550° C. for 15 to 60 minutes, and they are different in purpose, temperature, and time. The steps of drying and baking are performed under normal pressure or under reduced pressure, by laser light irradiation, rapid thermal annealing, heating using a heating furnace, or the like. Note that the timing and the number of such heat treatment is not particularly limited. In order to favorably perform the steps of drying and baking, the temperature at that time depends on the material of the substrate and a property of the composition, and the temperature is generally to be a room temperature to 800° C. (preferably, 100 to 550° C.). Through these steps, a peripheral resin is hardened and shrunk in addition to volatilizing of the solvent in the composition or chemically removing the dispersant, whereby the nanoparticles are made in contact with each other and fusion and welding are accelerated.

A continuous wave or pulsed gas laser or solid-state laser may be used for laser irradiation. An excimer laser, a YAG laser, or the like can be used as the former gas laser. A laser using a crystal of YAG, $YVO_4$, $GdVO_4$, or the like which is doped with Cr, Nd, or the like can be used as the latter solid-state laser. A continuous wave laser is preferably used in consideration of the absorptance of a laser beam. Moreover, a laser irradiation method in which pulsed and continuous wave lasers are combined may be used. However, the heat treatment by laser irradiation may be instantaneously performed within several microseconds to several tens of seconds so as not to damage the substrate, depending on heat resistance of the substrate. Rapid thermal annealing (RTA) is carried out by raising the temperature rapidly and applying of heat to the substrate instantaneously for several microseconds to several minutes with the use of an infrared lamp, a halogen lamp, or the like which emits ultraviolet to infrared light in an inert gas atmosphere. Since this treatment is performed instantaneously, only an outermost thin film can practically be heated and the lower layer of the film is not adversely affected. In other words, even a substrate having low heat resistance such as a plastic substrate is not adversely affected.

After the conductive layer or the like is formed by discharging the composition by a droplet discharge method, the surface thereof may be planarized to enhance planarity. As a pressing method, concavity and convexity may be reduced by scanning the surface with a roller-shaped object, or the surface may be pressed perpendicularly by a flat plate-shaped object. A heating step may be performed at the time of pressing. Alternatively, the concavity and convexity of the surface may be removed with an air knife after the surface is softened or melted with a solvent or the like. A CMP method may also be used for polishing the surface. This step can be employed in planarizing a surface when concavity and convexity are generated by a droplet discharge method.

In the case where a conductive layer (or an insulating layer) is formed using a droplet discharge method, it is formed as follows: a composition containing a conductive material (or an insulating material) which is processed into a particle state is discharged, and the composition is fused or welded by baking to be solidified. The conductive layer (or the insulating layer) thus formed by discharging and baking of the composition containing a conductive material tends to have a polycrystalline structure having the large number of grain boundaries, whereas the conductive layer (or the insulating layer) formed by a sputtering method or the like tends to have a columnar structure.

Although an example in which the conductive layer is formed is described using the present invention in this embodiment mode, an insulating layer, a semiconductor layer, or the like can also be manufactured using the present invention with the use of an insulating material or a semiconductor material as the formation material contained in the liquid composition to be discharged.

According to this embodiment mode using the present invention, the bubbles in the pressurizing chamber can be removed without disposing of a large quantity of materials in a droplet discharge method using a droplet discharge device; thus, defective discharging can be prevented.

Thus, a wiring such as a conductive layer or an insulating layer, which is manufactured using the droplet discharge method of this embodiment mode using the present invention, can prevent a defective shape such as disconnection due to defective discharging. With the use of the wiring or the insulating layer formed by this embodiment mode using the present invention, a semiconductor device or a display device which is highly reliable can be manufactured at low cost with high yield.

Embodiment Mode 2

In this embodiment mode, a droplet discharge method in which bubbles in a pressurizing chamber are removed without disposing of a large quantity of materials so as to prevent defective discharging will be explained with reference to FIGS. 3A and 3B. Specifically, an example of a material supply state in a material supply chamber which is different from that in Embodiment Mode 1 will be explained. Thus, portions which are the same as those in Embodiment Mode 1 or which have similar functions to those in Embodiment Mode 1 are similar to those in Embodiment Mode 1 and repetitive explanation thereof will be omitted.

Figure 3A:
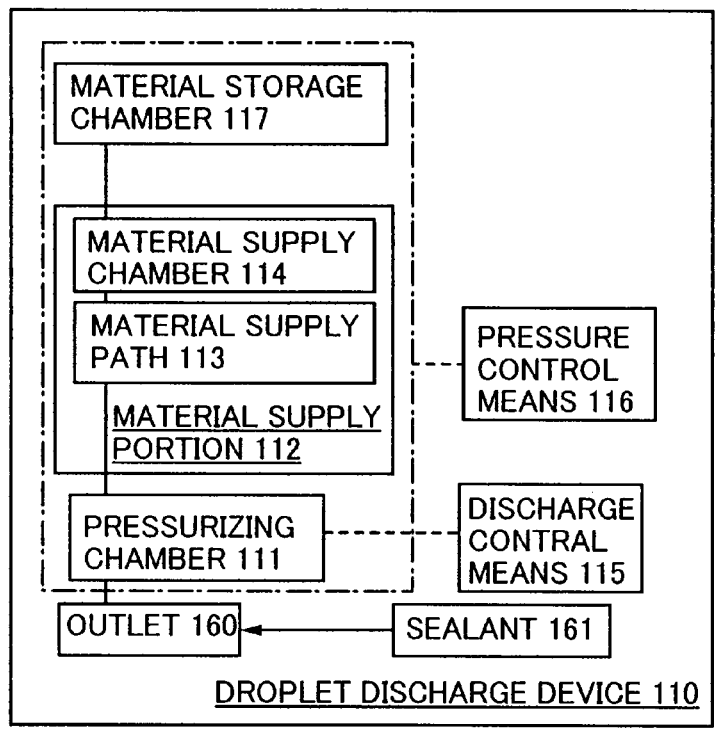
FIGS. 3A and 3B are block diagrams illustrating a droplet discharge device of the present invention.
Figure 3B:
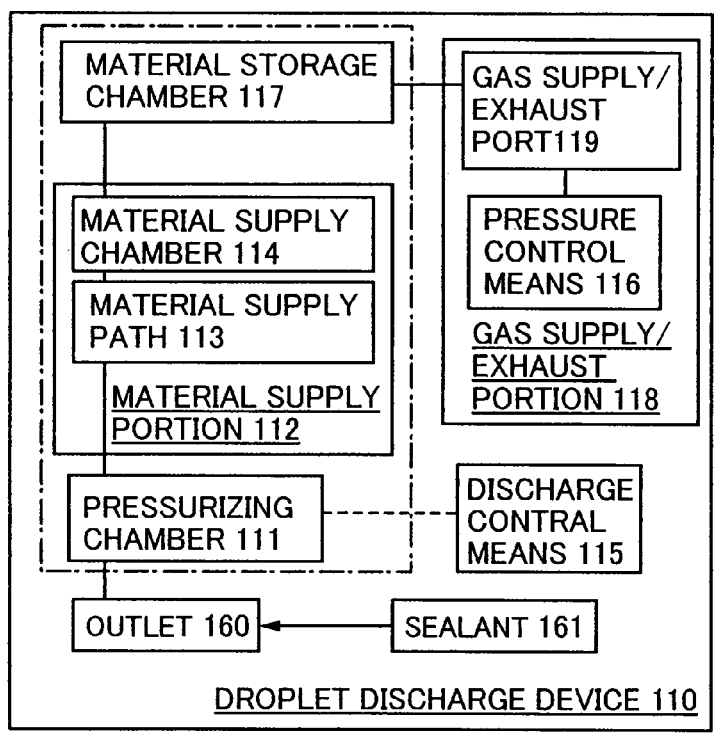

A block diagram of a droplet discharge device in this embodiment mode is illustrated in FIGS. 3A and 3B. FIG. 3B is a more specific example of FIG. 3A.

As illustrated in FIG. 3A, a droplet discharge device 110 has a pressurizing chamber 111, a material supply portion 112 including a material supply path 113 and a material supply chamber 114, a material storage chamber 117, a discharge control means 115 for the pressurizing chamber 111, and a pressure control means 116 which controls pressure in the pressurizing chamber 111, the material supply portion 112, and the material storage chamber 112, which are surrounded with a dashed line. The pressurizing chamber 111 is provided with an outlet 160, which can be sealed with a sealant 161.

In FIG. 3B, the material storage chamber 117 is provided with a gas supply/exhaust port 119 as a part of a gas supply/exhaust portion 118, and gas is supplied or exhausted by the pressure control means 116 connected to the gas supply/exhaust port 119. Accordingly, pressure in the pressurizing chamber 111, the material supply portion 112 (the material supply path 113 and the material supply chamber 114), and the material storage chamber 117 is controlled. For example, when exhaust is performed with a pump or the like as the pressure control means 116, a reduced pressure state can be kept in the pressurizing chamber 111, the material supply portion 112 (the material supply path 113 and the material supply chamber 114), and the material storage chamber 117. On the other hand, when gas is supplied, a pressurized state can be kept in the pressurizing chamber 111, the material supply portion 112 (the material supply path 113 and the material supply chamber 114), and the material storage chamber 117.

This embodiment mode describes an example in which the material supply chamber 114 is completely filled with the composition containing film-forming material, which is a material, and the liquid surface of the composition containing film-forming material is in the material storage chamber 117. The composition containing film-forming material is supplied to the material supply chamber 114 from the material storage chamber 117 and supplied to the pressurizing chamber 111 from the material supply chamber 114 through the material supply path 113 to fill the pressurizing chamber 111. In this embodiment mode, a reduced pressure state is kept in the pressurizing chamber, the material supply path, and the material supply chamber, which are filled with a material, by exhaust. A closed space which is to be kept in a reduced pressure state needs to have a space with gas (air in this embodiment mode). Thus, in this embodiment mode, the gas in the material storage chamber 117 is exhausted, whereby pressure in the pressurizing chamber 111, the material supply path 113, and the material supply chamber 114, which are connected in series, is reduced.

Thus, the pressure control means 116 controls pressure in the pressurizing chamber 111, the material supply path 113, the material supply chamber 114, and the material storage chamber 117.

Bubbles may be in the material supply chamber 114, the material supply path 113, and the pressurizing chamber 111 by mixture of air, or the like in supplying the material to the material supply chamber and the pressurizing chamber. Since the bubbles are gas, bubbles easily expand and shrink than liquid. Therefore, when bubbles are in the pressurizing chamber, the applied pressure is absorbed by the gas. Consequently, inability to apply sufficient pressure to liquid causes defective discharge. In addition, there is a possibility that even a bubble present in the material supply path or the material supply chamber also flows into the pressurizing chamber during discharging and causes defective discharge.

In this embodiment mode, before the composition containing film-forming material, which is a material, is discharged, a step is provided in which a reduced pressure state is kept in the pressurizing chamber 111, the material supply path 113, the material supply chamber 114, and the material storage chamber 117, which are connected, and bubbles that are in the pressurizing chamber 111 are removed.

Flow paths connected to an outside other than the gas supply/exhaust port 119, such as the outlet 160 provided for the pressurizing chamber 111 and the material supply port provided for the material supply chamber 114 are sealed, and pressure in the pressurizing chamber, the material supply path, and the material supply chamber is reduced using the pressure control means such as a pump which is provided in the gas supply/exhaust portion 118.

The gas in the pressurizing chamber 111, the material supply path 113, the material supply chamber 114, and the material storage chamber 117, which become a closed space hermetically sealed by the sealant, is exhausted from the gas supply/exhaust portion 118. The gas is exhausted from the gas supply/exhaust portion; therefore, pressure in the pressurizing chamber 111, the material supply path 113, the material supply chamber 114, and the material storage chamber 117 is reduced. After that, the gas supply/exhaust portion is also sealed by a cock or the like, and pressure in the pressurizing chamber 111, the material supply path 113, the material supply chamber 114, and the material storage chamber 117 is reduced.

Since a volume of bubbles Vb is in inverse proportion to a pressure Pt in the pressurizing chamber 111, the material supply path 113, the material supply chamber 114, and the material storage chamber 117, it follows that Vb=C/Pt; whereas, since a buoyancy F applied to the bubbles is in proportion to the volume of the bubbles Vb and density ρi of a material, it follows that F=C×ρi/Pt. Note that C is a constant. When the pressure Pt in the pressurizing chamber 111, the material supply path 113, the material supply chamber 114, and the material storage chamber 117 is reduced, the buoyancy F applied to the bubbles increases. Consequently, the buoyancy is applied to the bubbles that are in the material, and the bubbles rise (are transferred) from the pressurizing chamber 111 to the material storage chamber 117 where there is the liquid surface of the material.

Thus, the bubbles can be removed from the pressurizing chamber 111. In addition, in the material storage chamber 117, the bubbles rise to the liquid surface of the material and break or remain on the liquid surface of the material by being foamed. Therefore, a risk that the bubbles will flow into (enter) the pressurizing chamber 111 can be reduced substantially.

Note that, after a reduced pressure state is kept in the pressurizing chamber 111, the material supply path 113, the material supply chamber 114, and the material storage chamber 117 and the bubbles are discharged from the composition containing film-forming material to an interface of the composition, the cock of the gas supply/exhaust port is opened and gas is supplied by the pressure control means 116. Accordingly, a normal pressure or pressurized state is kept in the pressurizing chamber 111, the material supply path 113, the material supply chamber 114, and the material storage chamber 117. After the sealant is removed, voltage is applied to the pressurizing chamber 111 so that the composition containing film-forming material can be discharged from the outlet.

After pressure in the pressurizing chamber, the material supply path, and the material supply chamber is reduced, the pressurizing chamber may be vibrated in a reduced pressure state in order to efficiently remove bubbles that are in the pressurizing chamber by being transferred to the material supply chamber. The pressurizing chamber is vibrated, whereby bubbles that are trapped in an uneven form in the pressurizing chamber are transferred and the bubbles can be efficiently removed from the pressurizing chamber. In addition, as long as an opening is sealed with the sealant, a sealant of any material or shape may be used. A flexible material is preferably used, and resin in gel or gum, or the like can be used. Alternatively, the opening can be sealed with good adhesion by an adhesive tape or the like. Note that, as the material used for the sealant, a material that does not react with the composition containing film-forming material to be discharged is preferable.

In addition, in order to seal the material supply port provided between the material supply chamber and the material storage chamber or seal the gas supply/exhaust port in the gas supply/exhaust portion, the connected paths (pipes) may be blocked using a valve, a cock, or the like.

According to this embodiment mode using the present invention, the bubbles in the pressurizing chamber can be removed without disposing of a large quantity of materials in a droplet discharge method using a droplet discharge device; thus, defective discharging can be prevented.

Thus, a wiring such as a conductive layer or an insulating layer, which is manufactured using the droplet discharge method of this embodiment mode using the present invention, can prevent a defective shape such as disconnection due to defective discharging. With the use of the wiring or the insulating layer formed by this embodiment mode using the present invention, a semiconductor device or a display device which is highly reliable can be manufactured at low cost with high yield.

Embodiment Mode 3

In this embodiment mode, a droplet discharge method in which bubbles in a pressurizing chamber are removed without disposing of a large quantity of materials so as to prevent defective discharging will be explained with reference to FIGS. 4A and 4B. Specifically, an example in which a vibrating means is provided in addition to the structure in Embodiment Mode 1 will be explained. Thus, portions which are the same as those in Embodiment Mode 1 or which have similar functions to those in Embodiment Mode 1 are similar to those in Embodiment Mode 1 and repetitive explanation thereof will be omitted.

Figure 4A:
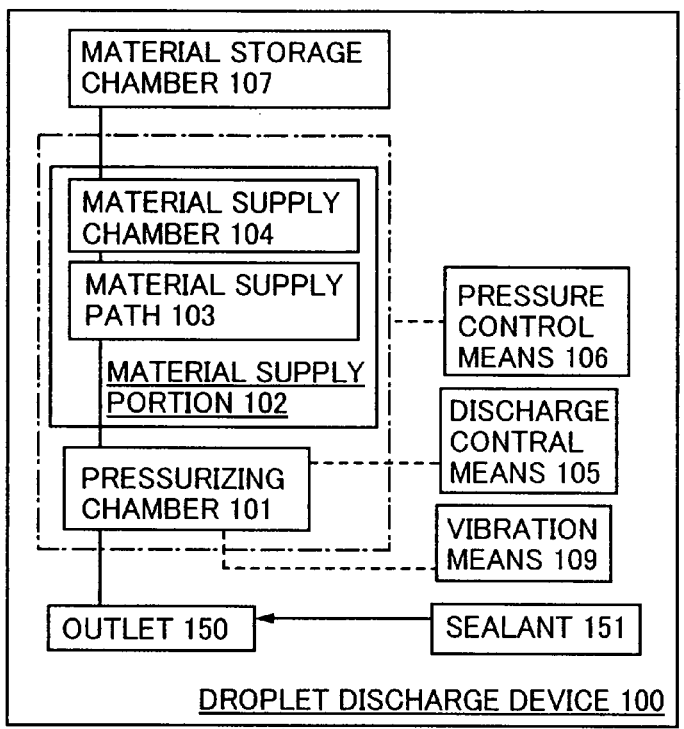
FIGS. 4A and 4B are block diagrams illustrating a droplet discharge device of the present invention.
Figure 4B:
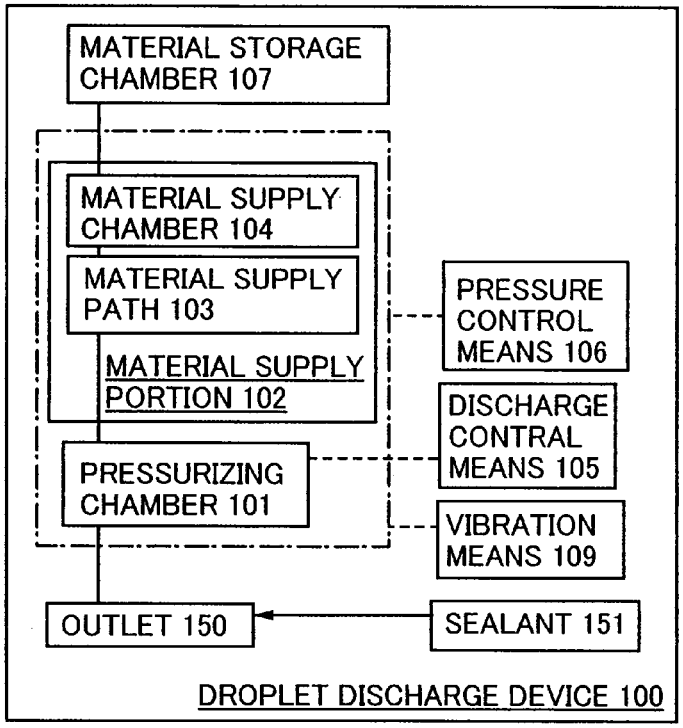

A block diagram of a droplet discharge device in this embodiment mode is illustrated in FIGS. 4A and 4B.

As illustrated in FIG. 4A, a droplet discharge device 100 has a pressurizing chamber 101, a material supply portion 102 including a material supply path 103 and a material supply chamber 104, a material storage chamber 107, a discharge control means 105 for the pressurizing chamber 101, a pressure control means 106 which controls pressure in the pressurizing chamber 101 and the material supply portion 102, which are surrounded with a dashed line, and a vibrating means 109 for the pressurizing chamber 101. The pressurizing chamber 101 is provided with an outlet 150, which can be sealed with a sealant 151.

In this embodiment mode, before the composition containing film-forming material, which is a material, is discharged, a step is provided in which, a reduced pressure state is kept in the pressurizing chamber 101, the material supply path 103, and the material supply chamber 104, which are connected, and bubbles that are in the pressurizing chamber 101 are removed.

Flow paths connected to an outside other than the gas supply/exhaust port in the gas supply/exhaust portion, such as the outlet 150 provided for the pressurizing chamber 101 and the material supply port provided for the material supply chamber 104 are sealed, and pressure in the pressurizing chamber, the material supply path, and the material supply chamber is reduced using the pressure control means such as a pump which is provided in the gas supply/exhaust portion.

The gas in the pressurizing chamber 101, the material supply path 103, and the material supply chamber 104, which become a closed space hermetically sealed by the sealant, is exhausted from the gas supply/exhaust portion. The gas is exhausted from the gas supply/exhaust portion; therefore, pressure in the pressurizing chamber 101, the material supply path 103, and the material supply chamber 104 is reduced. After that, the cock provided for the gas supply/exhaust port in the gas supply/exhaust portion is sealed, and pressure in the pressurizing chamber 101, the material supply path 103, and the material supply chamber 104 is reduced.

Since a volume of bubbles Vb is in inverse proportion to a pressure Pt in the pressurizing chamber 101, the material supply path 103, and the material supply chamber 104, it follows that Vb=C/Pt; whereas, since a buoyancy F applied to the bubbles is in proportion to the volume of the bubbles Vb and density ρi of a material, it follows that F=C×ρi/Pt. Note that C is a constant. When the pressure in the pressurizing chamber 101, the material supply path 103, and the material supply chamber 104 is reduced, the pressure Pt decreases; thus, the buoyancy F applied to the bubbles increases. Consequently, the buoyancy is applied to the bubbles that are in the material, and the bubbles rise (are transferred) from the pressurizing chamber 101 to the material supply chamber 104 where there is the liquid surface of the material.

Thus, the bubbles can be removed from the pressurizing chamber 101. In addition, in the material supply chamber 104, the bubbles rise to the liquid surface of the material and break or remain on the liquid surface of the material. Therefore, a risk that the bubbles will flow into (enter) the pressurizing chamber 101 can be reduced substantially.

In this embodiment mode, in order to remove bubbles more efficiently, the pressurizing chamber 101 is vibrated in a reduced pressure state by the vibrating means 109. FIG. 4A illustrates an example in which the pressurizing chamber 101 is vibrated by the vibrating means 109. FIG. 4B illustrates an example in which the vibrating means 109 is provided which vibrates the material supply portion 102 (the material supply chamber 104 and the material supply path 103) as well as the pressurizing chamber 101 by coupling them. In such a manner, the vibrating means may be provided only for the pressurizing chamber, or also for the material supply portion and the like. The pressurizing chamber is vibrated, whereby bubbles that are trapped in an uneven form in the pressurizing chamber are transferred and the bubbles can be efficiently removed from the pressurizing chamber.

The vibrating means may be movable so that a supporting base, which supports a head portion in which the pressurizing chamber is provided, can be rotated up and down and right and left. Further, the direction of movement may also be only up and down, or only right and left.

Note that, after a reduced pressure state is kept in the pressurizing chamber 101, the material supply path 103, and the material supply chamber 104 and the bubbles are discharged from the composition containing film-forming material to an interface of the composition, the cock of the gas supply/exhaust port is opened and gas is supplied by the pressure control means 106. Accordingly, a normal pressure or pressurized state is kept in the pressurizing chamber 101, the material supply path 103, and the material supply chamber 104. Then, after the sealant 151 is removed, voltage is applied to the pressurizing chamber 101 so that the composition containing film-forming material can be discharged from the outlet.

In addition, as long as an opening is sealed with the sealant, a sealant of any material or shape may be used. A flexible material is preferably used, and resin in gel or gum, or the like can be used. Alternatively, the opening can be sealed with good adhesion by an adhesive tape or the like. Note that, as the material used for the sealant, a material that does not react with the composition containing film-forming material to be discharged is preferable.

In addition, in order to seal the material supply port provided between the material supply chamber and the material storage chamber or seal the gas supply/exhaust port in the gas supply/exhaust portion, the connected paths (pipes) may be blocked using a valve, a cock, or the like.

According to this embodiment mode using the present invention, the bubbles in the pressurizing chamber can be removed without disposing of a large quantity of materials in a droplet discharge method using a droplet discharge device; thus, defective discharging can be prevented.

Thus, a wiring such as a conductive layer or an insulating layer, which is manufactured using the droplet discharge method of this embodiment mode using the present invention, can prevent a defective shape such as disconnection due to defective discharging. With the use of the wiring or the insulating layer formed by this embodiment mode using the present invention, a semiconductor device or a display device which is highly reliable can be manufactured at low cost with high yield.

Embodiment Mode 4

In this embodiment mode, a droplet discharge method in which bubbles in a pressurizing chamber are removed without disposing of a large quantity of materials so as to prevent defective discharging will be explained with reference to FIG. 5. Specifically, the droplet discharge device described in Embodiment Mode 1 will be explained in detail. Thus, portions which are the same as those in Embodiment Mode 1 or which have similar functions to those in Embodiment Mode 1 are similar to those in Embodiment Mode 1 and repetitive explanation thereof will be omitted.

Figure 5:
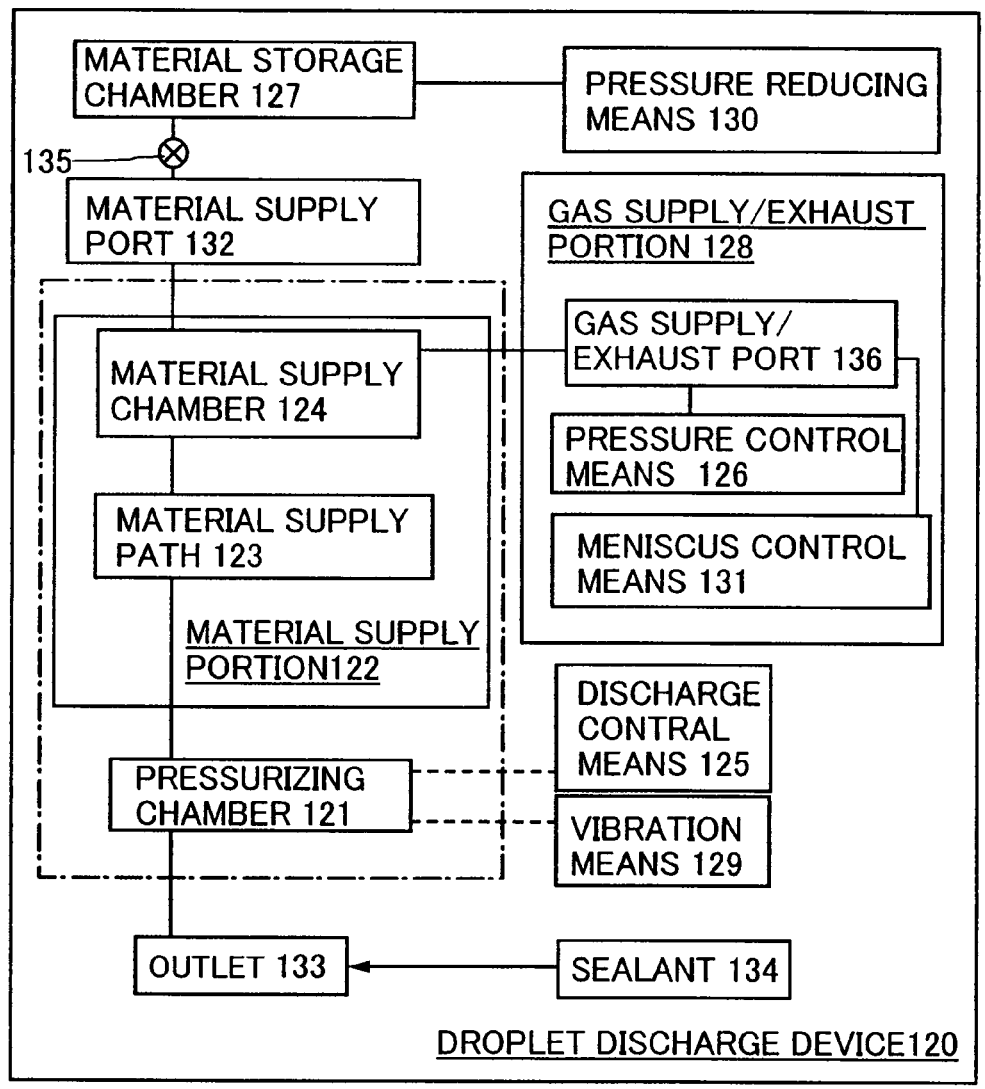
FIG. 5 is a block diagram illustrating a droplet discharge device of the present invention.

A block diagram of a droplet discharge device in this embodiment mode is illustrated in FIG. 5. As illustrated in FIG. 5, a droplet discharge device 120 has a pressurizing chamber 121, a material supply portion 122 including a material supply path 123 and a material supply chamber 124, a material storage chamber 127, a discharge control means 125 for the pressurizing chamber 121, a pressure control means 126 which controls pressure in the pressurizing chamber 121 and the material supply portion 122, which are surrounded with a dashed line, a pressure reducing means 130 which reduces pressure in the material storage chamber 127, a cock 135 which opens and closes a material supply port 132, and a vibrating means 129 for the pressurizing chamber 121.

The material supply chamber 124 is provided with a gas supply/exhaust port 136 in a gas supply/exhaust portion 128 and the material supply port 132. In this embodiment mode, the composition containing film-forming material, which is a material, is supplied from the material storage chamber 127 to have a space to the material supply chamber 124. Thus, gas in the material supply chamber 124 is supplied or exhausted from the gas supply/exhaust portion 128, whereby pressure in the pressurizing chamber 121 and the material supply portion 122 (the material supply path 123 and the material supply chamber 124) is controlled. For example, when exhaust is performed with the pressure control means 126 such as a pump in the gas supply/exhaust portion 128, a reduced pressure state can be kept in the pressurizing chamber 121 and the material supply portion 122 (the material supply path 123 and the material supply chamber 124). On the other hand, when gas is supplied, a pressurized state can be kept in the pressurizing chamber 121 and the material supply portion 122 (the material supply path 123 and the material supply chamber 124). Moreover, the droplet discharge device 120 has a meniscus control means 131 which controls a liquid interface between the material supplied to an outlet 133 and air. As in this embodiment mode, the gas supply/exhaust port 136 of the gas supply/exhaust portion 128 may also be used as a connection port for connecting the meniscus control means 131 to the material supply chamber (also referred to as a meniscus adjustment port).

In this embodiment mode, before the composition containing film-forming material, which is a material, is discharged, a step is provided in which a reduced pressure state is kept in the pressurizing chamber 121, the material supply path 123, and the material supply chamber 124, which are connected, and bubbles that are in the pressurizing chamber 121 are removed.

Flow paths connected to an outside other than the gas supply/exhaust port 136 in the gas supply/exhaust portion 128, such as the outlet 133 provided for the pressurizing chamber 121 and the material supply port 132 provided for the material supply chamber are sealed, and pressure in the pressurizing chamber, the material supply path, and the material supply chamber is reduced with the use of the pressure control means 126 such as a pump provided in the gas supply/exhaust portion 128.

The gas in the pressurizing chamber 121, the material supply path 123, and the material supply chamber 124, which become a closed space hermetically sealed by a sealant 134, is exhausted from the gas supply/exhaust portion 128. The gas is exhausted from the gas supply/exhaust portion 128; therefore, pressure in the pressurizing chamber 121, the material supply path 123, and the material supply chamber 124 is reduced. After that, the gas supply/exhaust port 136 in the gas supply/exhaust portion is sealed with the cock, and pressure in the pressurizing chamber 121, the material supply path 123, and the material supply chamber 124 is reduced.

Since a volume of bubbles Vb is in inverse proportion to a pressure. Pt in the pressurizing chamber 121, the material supply path 123, and the material supply chamber 124, it follows that Vb=C/Pt; whereas, since a buoyancy F applied to the bubbles is in proportion to the volume of the bubbles Vb and density ρi of a material, it follows that F=C×ρi/Pt. Note that C is a constant. When the pressure Pt in the pressurizing chamber 121, the material supply path 123, and the material supply chamber 124 is reduced, the buoyancy F applied to the bubbles increases. Consequently, the buoyancy is applied to the bubbles that are in the material, and the bubbles rise (are transferred) from the pressurizing chamber 121 to the material supply chamber 124 where there is the liquid surface of the material.

Thus, the bubbles can be removed from the pressurizing chamber 121. In addition, in the material supply chamber 124, the bubbles rise to the liquid surface of the material and break or remain on the liquid surface of the material. Therefore, a risk that the bubbles will flow into (enter) the pressurizing chamber 121 can be reduced substantially.

In this embodiment mode, in order to remove bubbles more efficiently, the pressurizing chamber 121 is vibrated in a reduced pressure state by the vibrating means 129. The vibrating means may be provided only for the pressurizing chamber, or also for the material supply portion and the like. The pressurizing chamber is vibrated, whereby bubbles that are trapped in an uneven form in the pressurizing chamber are transferred and the bubbles can be efficiently removed from the pressurizing chamber.

In order to transfer the bubbles that are in the pressurizing chamber and the material supply path to the material supply chamber, the vibrating means may be movable so that a supporting base, which supports a head portion in which the pressurizing chamber is provided, can be rotated up and down and right and left so that the pressurizing chamber is tilted obliquely. Further, the direction of movement may also be only up and down, or only right and left.

Note that, after a reduced pressure state is kept in the pressurizing chamber 121, the material supply path 123, and the material supply chamber 124 and the bubbles are discharged from the composition containing film-forming material to an interface of the composition, the cock provided for the gas supply/exhaust port 136 is opened and gas is supplied by the pressure control means 126. Accordingly, a normal pressure or pressurized state is kept in the pressurizing chamber 121, the material supply path 123, and the material supply chamber 124, and then the sealant 134 is removed. After that, voltage is applied to the pressurizing chamber 121 so that the composition containing film-forming material can be discharged from the outlet 133.

In a discharging method using a piezoelectric element, the discharge quantity of a material depends on a waveform of voltage applied to a piezoelectric element provided for the pressurizing chamber. Thus, the discharge quantity can be adjusted as appropriate by selection of a waveform of the applied voltage. Examples of a voltage waveform that can be used in the present invention is illustrated in FIGS. 7A to 7C.

Figure 7A:
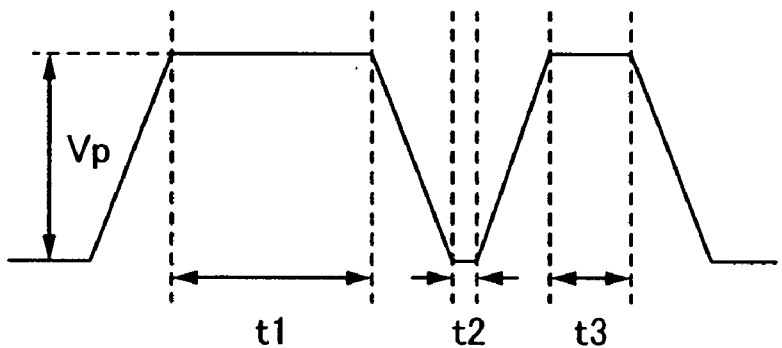
FIGS. 7A to 7C each illustrate a waveform of applied voltage which can be used for a droplet discharge device of the present invention.
Figure 7B:
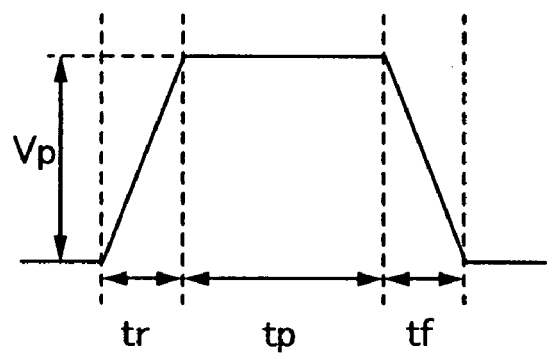
Figure 7C:
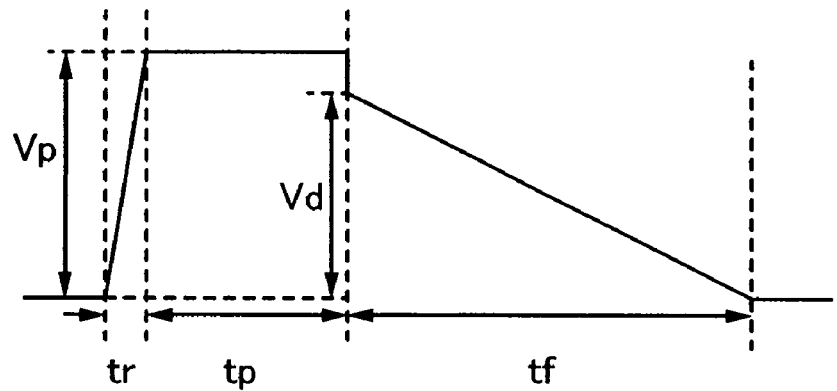

FIGS. 7A to 7C each illustrate an applied voltage waveform of a voltage which is necessary to discharge a droplet. FIG. 7A illustrates two sequential trapezoidal waves, which are referred to as a double pulse. The voltage waveform in FIG. 7A is an example in which an applied voltage Vp is 60 V, a time t1 is 25 μs, a time t2 is 3 μs, and a time t3 is 10 μs. FIG. 7B illustrates a trapezoidal wave. The voltage waveform in FIG. 7B is an example in which an applied voltage Vp is 60 V, a time tr is 3 μs, a time tp is 8 μs, and a time tf is 3 μs. In FIG. 7C, applied voltage is decreased in two phases. A voltage waveform in FIG. 7C is an example in which an applied voltage Vp is 60 V, an applied voltage Vd is 50 V, a time tr is 3 μs, a time tp is 15 μs, and a time tf is 30 μs. Moreover, the discharge quantity is also affected by the shape of a head of the droplet discharge device; therefore, the discharge quantity can be controlled according to the selection of the head shape and the applied voltage waveforms.

In addition, before the material is supplied to the material supply chamber 124, removal of bubbles (also referred to as degassing) in the composition containing film-forming material, which is a material, may be performed in the material storage chamber 127. The cock 135 which is a valve for controlling supply and exhaust of gas is closed to separate the material storage chamber 127 and the material supply chamber 124. Further, the material storage chamber 127 becomes a closed space, and a reduced pressure state is kept in the material storage chamber 127 by the pressure means 130. The pressure of bubbles in the material in the material storage chamber 127 is reduced, whereby the bubbles rise to the liquid surface of the material; thus, the number of bubbles in the material can be reduced and the bubbles can be removed. When the bubbles in the material are removed in the material storage chamber 127 too before the material is supplied to the material supply chamber 124 in such a manner, the number of bubbles in the material can be reduced more. In order to reduce the pressure in the material storage chamber 127, the material storage chamber 127 may be provided with a gas exhaust port and gas may be exhausted from the gas exhaust port with the use of a pump or the like so that the pressure in the material storage chamber 127 is reduced. After the bubbles are removed, the material storage chamber 127 may be opened and returned to a normal pressure state.

Viscosity and the like of the composition containing film-forming material are adjusted using a solvent. In this case, the solvent and the liquid composition containing film-forming material may be mixed and supplied to the pressurizing chamber. Alternatively, first, the solvent may be supplied to the pressurizing chamber and degassed, and further, subsequently the composition containing film-forming material may be supplied to the pressurizing chamber and mixed in and degassing may be performed again. In other words, first, the material supply path and the pressurizing chamber are filled with the solvent from the material supply chamber and the outlet is sealed to have a reduced pressure state. The bubbles in the solvent rise to the surface of the liquid in the material supply chamber and are removed from the pressurizing chamber. After that, the composition containing film-forming material is supplied similarly to the solvent and mixed with the solvent which is supplied previously. The outlet is sealed again to have a reduced pressure state in the pressurizing chamber, the material supply path, and the material supply chamber. The bubbles in the composition, in which the material for forming a film, which is a material to be discharged, and the solvent are mixed, rise to the surface of the liquid in the material supply chamber and are removed from the pressurizing chamber. In such a manner, a step of removing bubbles may be performed more than once.

In addition, as long as an opening is sealed with the sealant, a sealant of any material or shape may be used. A flexible material is preferably used, and resin in gel or gum, or the like can be used. Alternatively, the opening can be sealed with good adhesion by an adhesive tape or the like. Note that, as the material used for the sealant, a material that does not react with the composition containing film-forming material to be discharged is preferable.

In addition, in order to seal the material supply port provided between the material supply chamber and the material storage chamber or seal the gas supply/exhaust port in the gas supply/exhaust portion, the connected paths (pipes) may be blocked using a valve, a cock, or the like.

According to this embodiment mode using the present invention, the bubbles in the pressurizing chamber can be removed without disposing of a large quantity of materials in a droplet discharge method using a droplet discharge device; thus, defective discharging can be prevented.

Thus, a wiring such as a conductive layer or an insulating layer, which is manufactured using the droplet discharge method of this embodiment mode using the present invention, can prevent a defective shape such as disconnection due to defective discharging. With the use of the wiring or the insulating layer formed by this embodiment mode using the present invention, a semiconductor device or a display device which is highly reliable can be manufactured at low cost with high yield. Such semiconductor devices and display devices can be used to manufacture various electronic devices.

As examples of the electronic devices according to the present invention, the following can be given: television devices (also simply referred to as televisions or television receivers), cameras such as digital cameras or digital video cameras, cellular phone devices (also simply referred to as cellular phone sets or cellular phones), portable information terminals such as PDAs, portable game machines, monitors for computers, computers, audio reproducing devices such as car audio devices, image reproducing devices provided with a recording medium such as home-use game machines, and the like.

Embodiment Mode 5

In this embodiment mode, a droplet discharge method in which bubbles in a pressurizing chamber are removed without disposing of a large quantity of materials so as to prevent defective discharging will be explained with reference to FIG. 6. Specifically, the droplet discharge device described in Embodiment Mode 1 will be explained in detail. Thus, portions which are the same as those in Embodiment Mode 1 or which have similar functions to those in Embodiment Mode 1 are similar to those in Embodiment Mode 1 and repetitive explanation thereof will be omitted.

Figure 6:
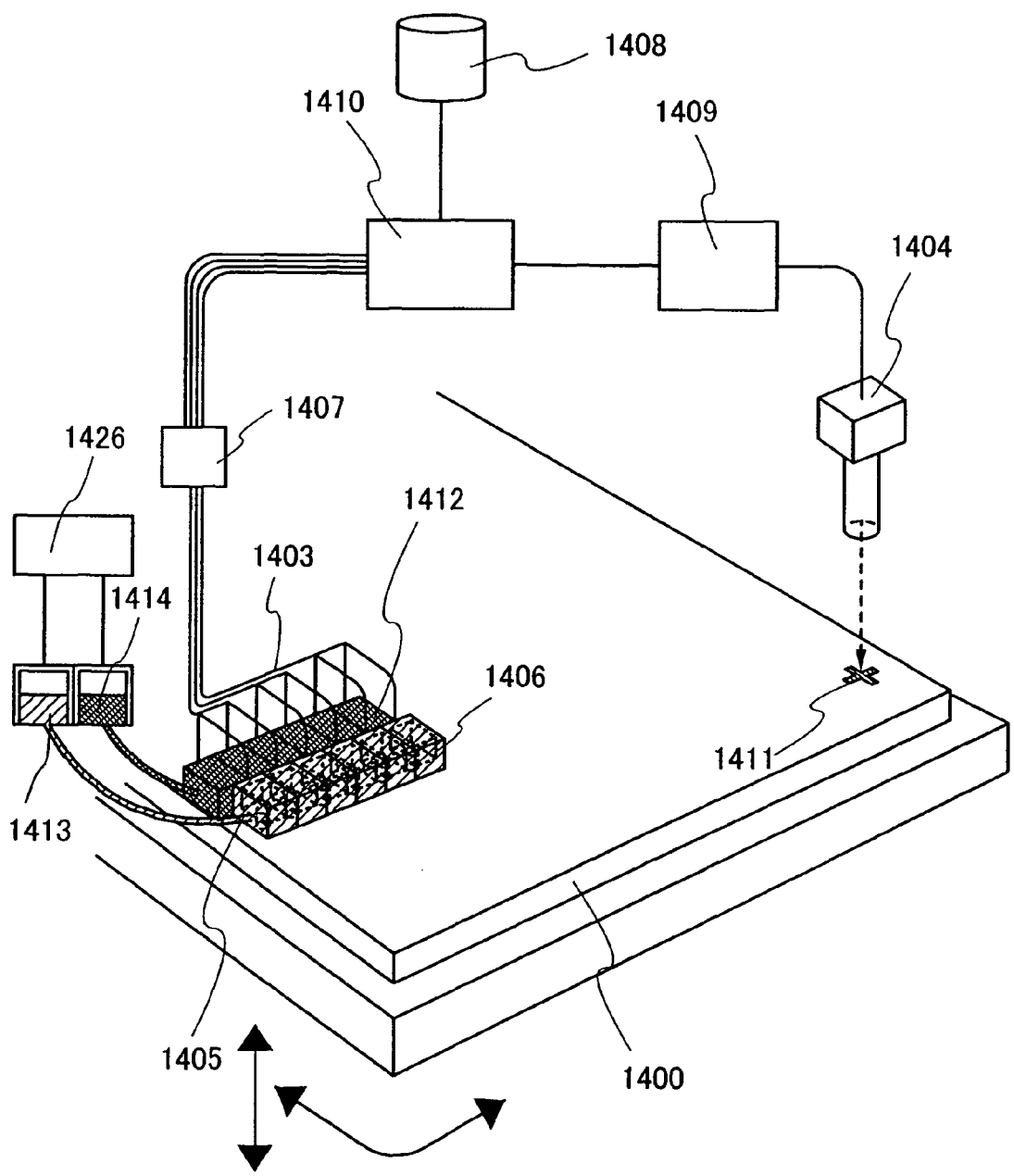
FIG. 6 illustrates a droplet discharge device of the present invention.

One mode of a droplet discharge apparatus used for a droplet discharge method is illustrated in FIG. 6. Each of heads 1405 and 1412 of a droplet discharge means 1403 is connected to a control means 1407, and this control means 1407 is controlled by a computer 1410, so that a preprogrammed pattern can be drawn. The drawing timing may be determined, for example, based on a marker 1411 that is formed over a substrate 1400. Alternatively, a reference point may be fixed based on the edge of the substrate 1400. The reference point is detected by an imaging means 1404, and converted into a digital signal by an image processing means 1409. Then, the digital signal is recognized by the computer 1410 and a control signal is generated, and the control signal is transmitted to the control means 1407. An image sensor or the like using a charge coupled device (CCD) or a complementary metal oxide semiconductor can be used as the imaging means 1404. Needless to say, information about a pattern to be formed over the substrate 1400 is stored in a storage medium 1408, and the control signal is transmitted to the control means 1407 based on the information, so that each of the heads 1405 and 1412 of the droplet discharge means 1403 can be individually controlled. The heads 1405 and 1412 are supplied through pipes with a material to be discharged, from material supply chambers 1413 and 1414, which are material supply sources, respectively. Note that the control means 1407 functions as a discharge control means.

The head 1405 has an internal structure which includes spaces filled with a liquid material as indicated by dotted lines 1406 and nozzles. Although not illustrated in FIG. 6, an internal structure of the head 1412 is similar to that of the head 1405. When the nozzle sizes of the heads 1405 and 1412 are different from each other, different materials with different widths can be discharged simultaneously. In addition, a conductive material, an organic material, an inorganic material, or the like can each be discharged from one head and drawing can be performed. In the case of drawing over a large area such as an interlayer film, one material can be simultaneously discharged from a plurality of nozzles to improve throughput; thus, drawing can be performed. When a large-sized substrate is used, the heads 1405 and 1412 can be freely scanned over the substrate in directions indicated by arrows in FIG. 6, and a drawing region can be freely set. Thus, a plurality of the same pattern can be drawn over the one substrate.

The material supply chambers 1413 and 1414 are filled with the material (the composition containing film-forming material) with spaces remaining. The material is supplied to the material supply path, the pressurizing chamber, and the nozzles which are provided in each of the heads 1405 and 1412. Before the discharging step, bubbles in the supplied material are removed using the present invention.

By a pressure control means 1426, in the heads 1405 and 1412 and the material supply chambers 1413 and 1414, an opening or openings such as outlets or the like of the nozzles other than gas supply/exhaust portions are sealed, and gas is exhausted. Accordingly, a reduced pressure state is kept in the material supply path and the pressurizing chamber provided in each of the heads 1405 and 1412.

Since a volume of bubbles Vb is in inverse proportion to a pressure Pt in the pressurizing chambers, the material supply paths, and the material supply chambers 1413 and 1414, it follows that $Vb=C/Pt$; whereas, since a buoyancy F applied to the bubbles is in proportion to the volume of the bubbles Vb and density $\rho i$ of a material, it follows that $F=C\times\rho i/Pt$. Note that C is a constant. When the pressure Pt in the pressurizing chambers, the material supply paths, and the material supply chambers 1413 and 1414 is reduced, the buoyancy F applied to the bubbles increases. Consequently, the buoyancy is applied to the bubbles that are in the material, and the bubbles rise (are transferred) from the pressurizing chambers to the material supply chambers 1413 and 1414 where there is the liquid surface of the material.

Thus, the bubbles can be removed from the pressurizing chambers. In addition, in the material supply chambers 1413 and 1414, the bubbles rise to the liquid surface of the material and break or remain there. Therefore, a risk that the bubbles will rise to (enter) the pressurizing chambers can be reduced substantially.

Note that, after a reduced pressure state is kept in the pressurizing chambers, the material supply paths, and the material supply chambers 1413 and 1414 and the bubbles are discharged from the composition containing film-forming material to an interface, a normal pressure or pressurized state is kept in the pressurizing chambers, the material supply paths, and the material supply chambers 1413 and 1414, and the sealant is removed. Then, voltage is applied to the pressurizing chambers and the composition containing film-forming material is discharged from the outlets in the nozzles.

In addition, as long as the opening is sealed with the sealant, a sealant of any material or shape may be used. A flexible material is preferably used, and resin in gel or gum, or the like can be used. Alternatively, the opening can be sealed with good adhesion by an adhesive tape or the like. Note that, as the material used for the sealant, a material that does not react with the composition containing film-forming material to be discharged is preferable.

In addition, in order to seal the material supply port provided between the material supply chamber and the material storage chamber or seal the gas supply/exhaust port in the gas supply/exhaust portion, the connected paths (pipes) may be blocked using a valve, a cock, or the like.

After reducing a pressure in the pressurizing chambers, the material supply paths, and the material supply chambers, the pressurizing chambers may be vibrated in a reduced pressure state in order to efficiently remove bubbles that are in the pressurizing chamber by being transferred to the material supply chamber. The pressurizing chambers are vibrated, whereby bubbles that are trapped in an uneven form in the pressurizing chambers are transferred and the bubbles can be efficiently removed from the pressurizing chambers.

According to this embodiment mode using the present invention, the bubbles in the pressurizing chambers can be removed without disposing of a quantity of materials in a droplet discharge method using a droplet discharge device; thus, defective discharging can be prevented.

Thus, a wiring such as a conductive layer or an insulating layer, which is manufactured using the droplet discharge method of this embodiment mode using the present invention, can prevent a defective shape such as disconnection due to defective discharging. With the use of the wiring or the insulating layer formed by this embodiment mode using the present invention, a semiconductor device or a display device which is highly reliable can be manufactured at low cost with high yield. Such semiconductor devices and display devices can be used to manufacture various electronic devices.

Embodiment Mode 6

In this embodiment mode, one mode of a droplet discharge device that can perform the droplet discharge method in which bubbles in a pressurizing chamber are removed without disposing of a large quantity of materials so as to prevent defective discharging will be explained with reference to FIG. 8. Portions which are the same as those in Embodiment Mode 1 or which have similar functions to those in Embodiment Modes 1 to 5 are similar to those in Embodiment Modes 1 to 5 and repetitive explanation thereof will be omitted.

Figure 8:
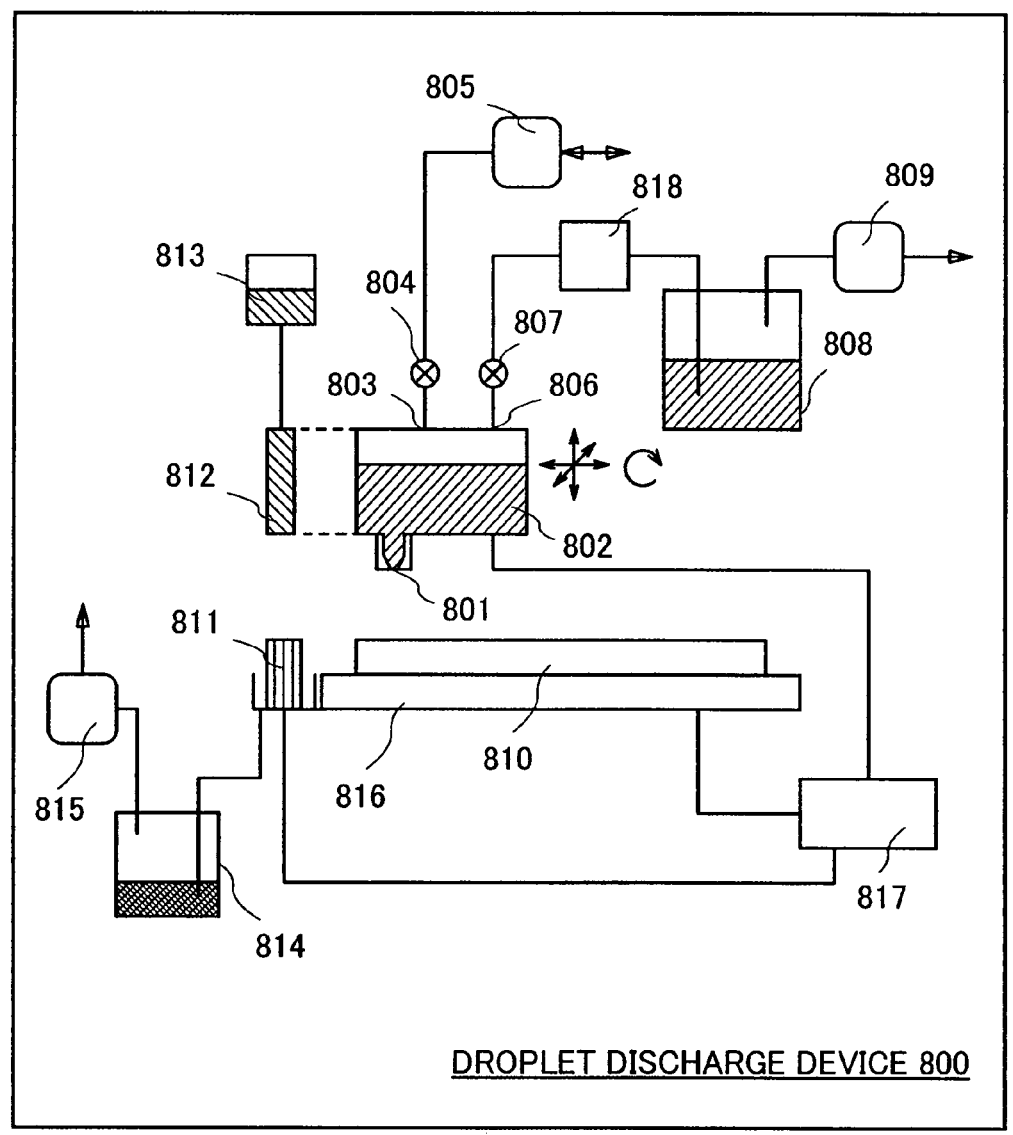
FIG. 8 illustrates a droplet discharge device of the present invention.

A schematic view of a droplet discharge device 800 in this embodiment mode is illustrated in FIG. 8. As illustrated in FIG. 8, the droplet discharge device 800 has a head portion 802, which has a pressurizing chamber, a material supply portion including a material supply path and a material supply chamber, and an outlet 801; a gas supply/exhaust port 803; a first cock 804; a pressure control means 805; a material supply port 806; a second cock 807; a material supply means 818; a material storage chamber 808; a pressure reducing means 809; an object to be processed 810; a sealing plate 811 which is a sealant; a cleaning solution discharging means 812, a cleaning solution storage chamber 813; a waste solution storage chamber 814; a pressure reducing means 815; a stage 816; and a scanning device 817.

By the scanning device 817, the head portion and the sealant can be relatively scanned and the head portion and the stage also can be relatively scanned. At least one of the head portion, the stage, and the sealant can be moved in XYZ directions and rotated in θ direction.

The gas supply/exhaust port 803 is opened and closed by the first cock 804, and the material supply port 806 is opened and closed by the second cock 807.

Supply or exhaust of gas is controlled by the pressure control means 805 and opening and closing of the first cock 804. The supply of a material to the head portion from the material storage chamber 808 is controlled by opening and closing of the second cock 807 and the material supply means 818. In addition, the second cock 807 is closed and pressure in the material storage chamber 808 is reduced by the pressure reducing means 809, so that bubbles in the material can be removed.

The material is attached to the sealing plate 811 since the sealing plate 811 seals the outlet 801 of the head portion 801. The material attached to the sealing plate 811 is cleaned by a cleaning solution discharged by the cleaning solution discharging means 812 from the cleaning solution storage chamber 813, and put into the waste solution storage chamber 814. The waste solution storage chamber 814 is exhausted by the pressure reducing means 815, and a waste solution in which a cleaning solution and a material solution are mixed is sucked into the waste solution storage chamber 814. As indicated by arrows in FIG. 8, the pressure control means 805, the pressure reducing means 809, and the pressure reducing means 815 perform air supply or exhaust to control pressure in the head portion 802, material storage chamber 808, and waste solution storage chamber 814 which are connected.

The gas supply/exhaust port 803 can also be used as a meniscus adjustment port that adjusts a liquid interface between the material supplied to the head portion 802 and air.

In this embodiment mode, an example is described in which the sealing plate which is the sealant is provided in contact with the stage and is scanned along with the stage. However, the sealing plate is not limited thereto and may be provided in other places in the droplet discharge device, allowing the sealant to be scanned independently. In addition, similarly, an example is described, in this embodiment mode in which the cleaning solution discharging means is also provided to neighbor to the head portion so that the cleaning solution discharging means is coupled with the head portion. However, the cleaning solution discharging means may be provided in other places in the droplet discharge device to permit the cleaning solution discharging means to scan independently. As in this embodiment mode, it is preferable to provide the sealant adjacent to the stage and the cleaning solution discharging means adjacent to the head portion, because it is not necessary to scan a wide range and the movement of the head portion is hardly disturbed.

In this embodiment mode, before a composition containing film-forming material, which is a material, is discharged, a reduced pressure state is kept in the connected head portion 802 and bubbles that are in the head portion 802 are removed.

At least either the head portion 802 or the sealing plate 811 is scanned by the scanner 817, and the outlet 801 of the head portion 802 and the sealing plate 811 are attached closely to seal the outlet 801. Either the head portion 802 or the sealing plate 811, or both may be scanned.

After the second cock 807 is also closed and only the first cock 804 is opened to exhaust the head portion 802 by the pressure control means 805, the first cock 804 is closed. A reduced pressure state can be kept in the head portion 802 by the pressure control means 805. The bubbles that are mixed in the material solution in the head portion 802 rise (are transferred) to the liquid surface of the material solution and break or remain there.

Thus, the bubbles can be removed from the head portion 803, in particular, from the pressurizing chamber. Further, a risk that the bubbles will rise to (enter) the pressurizing chambers from the material supply chamber can be reduced substantially.

In this embodiment mode, in order to remove bubbles more efficiently, the head portion may be vibrated in a reduced pressure state by a vibrating means. The head portion is vibrated, whereby bubbles that are trapped in an uneven form in the pressurizing chamber are transferred and the bubbles can be efficiently removed from the pressurizing chamber.

In order to transfer the bubbles that are in the pressurizing chamber and the material supply path to the material supply chamber, as the vibrating means, a mobile system that enables a supporting base, which supports the head portion in which the pressurizing chamber is provided, to rotate up and down, and right and left may be employed so that the vibrating means is tilted obliquely. The direction of movement may also be only up and down, or only right and left.

After the bubbles in the material solution in the head portion 802 are removed, the first cock 804 is opened and gas is supplied in the head portion 802 by the pressure control means 805. Accordingly, the head portion 802 is pressurized greater than that of the reduced pressure state, and a normal pressure or pressurized state is kept in the head portion 802.

After the head portion 802 and the sealing plate 811 are relatively scanned by the scanning device 817, the sealing plate 811 is kept away from the outlet 801. Then, the head portion 802 and the stage 816 are relatively scanned, and the outlet 801 is aligned with the discharging position of the object to be processed 810 by the scanning device 817.

Then, voltage is applied to the pressurizing chamber in the head portion 802 and the composition containing film-forming material, which is a material, is discharged from the outlet 801.

After the composition containing film-forming material is discharged onto the object to be processed, the sealing plate 811 is positioned under the cleaning solution discharging means 812, the cleaning solution is discharged onto the sealing plate, and the sealant is cleaned. As described above, the waste solution after cleaning may be put into the waste solution storage chamber 814 using the pressure reducing means 815.

In addition, as long as an opening is sealed with the sealing plate which is the sealant, a sealant of any material or shape may be used. A flexible material is preferably used, and resin in gel or gum, or the like can be used. Alternatively, the opening can be sealed with good adhesion by an adhesive tape or the like. Note that, as the material used for the sealant, a material that does not react with the composition containing film-forming material to be discharged is preferable.

According to this embodiment mode using the present invention, the bubbles in the pressurizing chamber can be removed without disposing of a large quantity of materials in a droplet discharge method using a droplet discharge device; thus, defective discharging can be prevented.

Thus, a wiring such as a conductive layer or an insulating layer, which is manufactured using the droplet discharge device of this embodiment mode using the present invention, can prevent a defective shape such as disconnection due to defective discharging. With the use of the wiring or the insulating layer formed by this embodiment mode using the present invention, a semiconductor device or a display device which is highly reliable can be manufactured at low cost with high yield.

The present application is based on Japanese Patent Application serial No. 2006-222722 filed on Aug. 17, 2006 in Japan Patent Office, the entire contents of which are hereby incorporated by reference.

What is claimed is:

1. A film forming method, comprising the steps of:
supplying a liquid composition containing film-forming material to a material supply chamber provided with a material supply port and a gas supply/exhaust port;
supplying the composition containing film-forming material to a pressurizing chamber provided with an outlet through a material supply path from the material supply chamber;
sealing the outlet and the material supply port;
reducing a pressure in the material supply chamber, the material supply path, and the pressurizing chamber by exhausting gas from the gas supply/exhaust port of the material supply chamber;
sealing the gas supply/exhaust port to make a reduced pressure state of the pressurizing chamber, the material supply path, and the material supply chamber;
pressurizing the material supply chamber, the material supply path, and the pressurizing chamber by opening the gas supply/exhaust port and supplying gas therefrom;
opening the outlet; and
discharging the composition containing film-forming material from the outlet by pressurizing the pressurizing chamber so as to form a film.

2. The method according to claim 1, wherein after supplying the composition containing film-forming material to the pressurizing chamber, there is a space above the composition containing film-forming material within the material supply chamber.

3. The method according to claim 1, wherein the pressurizing chamber is vibrated in the reduced pressure state.

4. The method according to claim 1, wherein the outlet is sealed by one of a sealant, a sealing plate, and an adhesive tape.

5. The method according to a claim 1, wherein the composition containing film-forming material is supplied to the material supply chamber from a material storage chamber via the material supply port.

6. The method according to claim 1, wherein each of the material supply port and the gas supply/exhaust port is sealed by a cock.

7. The method according to claim 1, wherein the composition containing film-forming material includes at least one of a conductive material and an insulating material.

8. The method according to claim 1, wherein the composition containing film-forming material includes a surfactant having fluorine.

9. A film forming method, comprising the steps of:
supplying a liquid composition containing film-forming material to a material supply chamber provided with a material supply port and a gas supply/exhaust port;
supplying the composition containing film-forming material to a pressurizing chamber provided with a plurality of outlets through a material supply path from the material supply chamber;
sealing the plurality of outlets and the material supply port;
reducing a pressure in the material supply chamber, the material supply path, and the pressurizing chamber by exhausting gas from the gas supply/exhaust port;
sealing the gas supply/exhaust port to make a reduced pressure state of the pressurizing chamber, the material supply path, and the material supply chamber;
pressurizing the material supply chamber, the material supply path, and the pressurizing chamber by opening the gas supply/exhaust port and supplying gas therefrom;
opening the plurality of outlets; and
discharging the composition containing film-forming material from the plurality of outlets by pressurizing the pressurizing chamber so as to form a film.

10. The method according to claim 9, wherein after supplying the composition containing film-forming material to the pressurizing chamber, there is a space above the composition containing film-forming material within the material supply chamber.

11. The method according to claim 9, wherein the pressurizing chamber is vibrated in the reduced pressure state.

12. The method according to claim 9, wherein the plurality of outlets are sealed by one of a sealant, a sealing plate, and an adhesive tape.

13. The method according to a claim 9, wherein the composition containing film-forming material is supplied to the material supply chamber from a material storage chamber via the material supply port.

14. The method according to claim 9, wherein each of the material supply port and the gas supply/exhaust port is sealed by a cock.

15. The method according to claim 9, wherein the composition containing film-forming material includes at least one of a conductive material and an insulating material.

16. The method according to claim 9, wherein the composition containing film-forming material includes a surfactant having fluorine.

17. A film forming method, comprising the steps of:
supplying a liquid composition containing film-forming material to a material supply chamber provided with a material supply port and a gas supply/exhaust port;
supplying the composition containing film-forming material to a pressurizing chamber provided with an outlet through a material supply path from the material supply chamber;
sealing the outlet and the material supply port;
reducing a pressure in the material supply chamber, the material supply path, and the pressurizing chamber by exhausting gas from the gas supply/exhaust port of the material supply chamber to move a bubble which exists in the pressurizing chamber to the material supply chamber;
sealing the gas supply/exhaust port to make a reduced pressure state of the pressurizing chamber, the material supply path, and the material supply chamber;
pressurizing the material supply chamber, the material supply path, and the pressurizing chamber by opening the gas supply/exhaust port and supplying gas therefrom;
opening the outlet; and
discharging the composition containing film-forming material from the outlet by pressurizing the pressurizing chamber so as to form a film.

18. The method according to claim 17, wherein after supplying the composition containing film-forming material to the pressurizing chamber, there is a space above the composition containing film-forming material within the material supply chamber.

19. The method according to claim 17, wherein the pressurizing chamber is vibrated in the reduced pressure state.

20. The method according to claim 17, wherein the outlet is sealed by one of a sealant, a sealing plate, and an adhesive tape.

21. The method according to a claim 17, wherein the composition containing film-forming material is supplied to the material supply chamber from a material storage chamber via the material supply port.

22. The method according to claim 17, wherein each of the material supply port and the gas supply/exhaust port is sealed by a cock.

23. The method according to claim 17, wherein the composition containing film-forming material includes at least one of a conductive material and an insulating material.

24. The method according to claim 17, wherein the composition containing film-forming material includes a surfactant having fluorine.

25. A film forming method, comprising the steps of:
supplying a liquid composition containing film-forming material to a material supply chamber provided with a material supply port and a gas supply/exhaust port;
supplying the composition containing film-forming material to a pressurizing chamber provided with a plurality of outlets through a material supply path from the material supply chamber;
sealing the plurality of outlets and the material supply port;
reducing a pressure in the material supply chamber, the material supply path, and the pressurizing chamber by exhausting gas from the gas supply/exhaust port to move a bubble which exists in the pressurizing chamber to the material supply chamber;
sealing the gas supply/exhaust port to make a reduced pressure state of the pressurizing chamber, the material supply path, and the material supply chamber;
pressurizing the material supply chamber, the material supply path, and the pressurizing chamber by opening the gas supply/exhaust port and supplying gas therefrom;
opening the plurality of outlets; and
discharging the composition containing film-forming material from the plurality of outlets by pressurizing the pressurizing chamber so as to form a film.

26. The method according to claim 25, wherein after supplying the composition containing film-forming material to the pressurizing chamber, there is a space above the composition containing film-forming material within the material supply chamber.

27. The method according to claim 25, wherein the pressurizing chamber is vibrated in the reduced pressure state.

28. The method according to claim 25, wherein the plurality of outlets are sealed by one of a sealant, a sealing plate, and an adhesive tape.

29. The method according to a claim 25, wherein the composition containing film-forming material is supplied to the material supply chamber from a material storage chamber via the material supply port.

30. The method according to claim 25, wherein each of the material supply port and the gas supply/exhaust port is sealed by a cock.

31. The method according to claim 25, wherein the composition containing film-forming material includes at least one of a conductive material and an insulating material.

32. The method according to claim 25, wherein the composition containing film-forming material includes a surfactant having fluorine.

* * * * *